United States Patent [19]

Osawa et al.

[11] Patent Number: 5,724,367
[45] Date of Patent: Mar. 3, 1998

[54] SEMICONDUCTOR MEMORY DEVICE HAVING SCAN PATH FOR TESTING

[75] Inventors: Tokuya Osawa; Hideshi Maeno, both of Tokyo, Japan

[73] Assignee: Mitsubishi Denki Kabushiki Kaisha, Tokyo, Japan

[21] Appl. No.: 608,048

[22] Filed: Feb. 28, 1996

[30] Foreign Application Priority Data

Oct. 19, 1995 [JP] Japan .................................. 7-271171

[51] Int. Cl.⁶ .................................................. G11C 29/00
[52] U.S. Cl. .................. 371/21.3; 371/21.1; 371/27.1; 371/22.34
[58] Field of Search .......................... 371/21.3, 21.1, 371/22.5, 22.34, 22.1, 27.1

[56] References Cited

FOREIGN PATENT DOCUMENTS 64 70999  3/1989  Japan .
4 302899  10/1992  Japan .

*Primary Examiner*—Phung Chung
*Attorney, Agent, or Firm*—Oblon, Spivak, McClelland, Maier & Neustadt, P.C.

[57] ABSTRACT

An address generator circuit (21A) includes a shift register (28) for storing therein address data (AD) to be outputted. A plurality of memory circuits which are equal in one of the numbers of bits of X and Y addresses for specifying rows or columns of memory cell arrays and different in the other number, apply data to scan paths so that less significant bits of the addresses having the same number of bits are stored in a position closer to an input terminal. An XOR gate (27A) in the address generator circuit (21A) generates write data (DI) for writing RAMs (31, 32) from data (X0, Y0) stored in predetermined registers of the shift register (28).

14 Claims, 18 Drawing Sheets

FIG. 17
(PRIOR ART)

| (0) | 1 | (2) | 3 | (4) | 5 | (6) | 7 |
|---|---|---|---|---|---|---|---|
| 8 | (9) | A | (B) | C | (D) | E | (F) |
| (10) | 11 | (12) | 13 | (14) | 15 | (16) | 17 |
| 18 | (19) | 1A | (1B) | 1C | (1D) | 1E | (1F) |
| (20) | 21 | (22) | 23 | (24) | 25 | (26) | 27 |
| 28 | (29) | 2A | (2B) | 2C | (2D) | 2E | (2F) |
| (30) | 31 | (32) | 33 | (34) | 35 | (36) | 37 |
| 38 | (39) | 3A | (3B) | 3C | (3D) | 3E | (3F) |

SEMICONDUCTOR MEMORY DEVICE HAVING SCAN PATH FOR TESTING

BACKGROUND OF THE INVENTION

1. Field of the Invention

The present invention relates to a semiconductor memory device and, more particularly, to a memory test circuit for checking a semiconductor memory device for fault.

2. Description of the Background Art

FIG. 16 illustrates a semiconductor memory device disclosed, for example, in Japanese Patent Application Laid-Open No. 3-59897 (1991) which comprises a memory cell array (EPROM cell array) 1, and X and Y decoders 2 and 3 for selecting cells in the memory cell array 1. The Y decoder 3 decodes address data A0, A1, A2 and the X decoder 2 decodes address data A3, A4, A5, thereby selecting a cell in the memory cell array 1.

FIG. 17 conceptually illustrates the memory cells arranged to form the memory cell array 1 of FIG. 16 and indicated by different numbers virtually assigned thereto for discrimination. A basic test of an EPROM typically includes confirming that all bits are erased, writing a checker board pattern, and reading data of all bits to check adjacent cells in the EPROM cell array for interaction. In FIG. 17, for example, "1" is written to the cells with alphanumeric characters in circles and "0" is written to the other cells, so that the memory cell array 1 is written with the checker board pattern.

Simply selectively writing only odd-numbered addresses or even-numbered addresses is not sufficient to write the checker board pattern to the memory cell array 1. The address selected by the Y decoder 3 is either even-numbered or odd-numbered depending on the address selected by the X decoder 2.

A RAM (random access memory) mounted in an application specific IC (ASIC) circuit, which is different in memory circuit type from the above stated EPROM, has input/output pins typically connected to a logic portion for applying a signal to the RAM, and thus is not directly tested using external pins. FIG. 18 illustrates a chip which includes a memory test circuit for testing the RAM mounted therein to have allowed a built-in RAM test. The memory test circuit contained in a chip 5 is referred to herein as a RAM-BIST (built-in self test) circuit.

During a normal operation wherein a signal RAM-TEST applied to a test pin 8 is, for example, "0", data given from external input pins 6 are processed in a logic portion 9, and the processed data are applied to RAMs 10a to 10c through selectors 12a to 12c. The data from the RAMs 10a to 10c are applied to a logic portion 11, and the data processed in the logic portion 11 are outputted from external output pins 7 to the exterior.

When the signal RAM-TEST applied to the test pin 8 is "1", the input pins of the RAMs 10a to 10c contained in the chip 5 are disconnected from the logic portion 9 by the selector circuits 12a to 12c but connected to a RAM-BIST circuit 14. The RAM-BIST circuit 14 functions to generate a test pattern, compares an output to be tested with an expected value, and compresses the test result. The RAM-BIST circuit 14 generates a variety of address patterns to test the RAMs 10a to 10c.

The conventional semiconductor memory device constructed as above described comprises the plurality of memory circuits 10a to 10c within the one chip 5. The memory circuits 10a to 10c are not limited to those having the same internal memory cell array structure but sometimes include memory cell arrays having different numbers of memory cells, rows and columns. As above noted, the data write must be controlled depending on both the rows and columns in order to write the checker board pattern. Thus, the memory circuits having different memory cell array structures necessitate the provision of a plurality of write circuits corresponding to the memory circuits of different constructions. Therefore, the semiconductor memory device wherein the memory test circuit for the plurality of memory circuits of different memory cell array constructions is contained in the chip is disadvantageous in that the size of a testing structure is increased, resulting in a decreased area for a circuit having the original functions of the chip.

Additionally, an approach to provide a common address generator circuit for the plurality of memory circuits of different memory cell constructions has created a need to conduct a test for each of the memory circuits of different constructions.

SUMMARY OF THE INVENTION

According to a first aspect of the present invention, a semiconductor memory device comprises: a first memory circuit including a first memory cell array of matrix form having memory cells each specified by first vertical address data indicative of one of the number of rows and the number of columns and first horizontal address data indicative of the other number, and a first scan path having $\alpha$ registers ($\alpha$ is a natural number) closer to its input terminal for storing the first vertical address data therein and $\beta$ registers ($\beta$ is a natural number) for storing the first horizontal address data therein; a second memory circuit including a second memory cell array of matrix form having memory cells each specified by second vertical address data indicative of the same one of the number of rows and the number of columns as the first vertical address data indicate and second horizontal address data indicative of the other number, and a second scan path having $\alpha$ registers closer to its input terminal for storing the second vertical address data therein and $\gamma$ registers ($\gamma$ is a natural number and not equal to $\beta$) for storing the second horizontal address data therein; an address generator circuit including a shift register for serially receiving at its input terminal a test address pattern to be outputted simultaneously to the first and second scan paths to store the test address pattern therein, and write signal generating means for generating a write signal in association with the test address pattern on the basis of data stored in a predetermined register of the shift register; and the first and second scan paths being constructed such that less significant bits of the first and second vertical address data and the first and second horizontal address data are stored in registers closer to the input terminals thereof than more significant bits, wherein write data transmitted through a signal line common to the first and second memory circuits are written to the first and second memory cell arrays in the first and second memory circuits according the test address pattern and the write signal.

Preferably, according to a second aspect of the present invention, the write signal is used as the write data.

Preferably, according to a third aspect of the present invention, the semiconductor memory device further comprises: data generating means for generating the write data, wherein write permission/inhibition of the first and second memory circuits is controlled in response to a write control signal, and wherein the write control signal is generated on the basis of the write signal.

Preferably, according to a fourth aspect of the present invention, the semiconductor memory device further comprising: a third memory circuit including a third memory cell array of matrix form having memory cells each specified by third vertical address data indicative of one of the number of rows and the number of columns and third horizontal address data indicative of the other number, and a third scan path having δ registers (δ is a natural number and not equal to α) closer to its input terminal for storing the third vertical address data therein and ε registers (ε is a natural number and not equal to β and γ) for storing the third horizontal address data therein; and the signal line common to the first and second memory circuits being also common to the third memory circuit, wherein the write data transmitted through the signal line are written to the third memory cell array in the third memory circuit in response to the test address pattern and the write signal, and wherein write permission/inhibition of the first to third memory circuits is individually controllable by write control signals.

Preferably, according to a fifth aspect of the present invention, the write signal generating means includes a logic device for outputting the exclusive-OR of data stored in a first register of the shift register and data stored in an (α+1)-th register thereof.

According to a sixth aspect of the present invention, a semiconductor memory device comprises: a plurality of memory circuits each including a memory cell array, a first scan path for storing first row address data for the memory cell array therein, and a second scan path for storing first column address data for the memory cell array therein; an address generator circuit including a first shift register for storing second row address data therein so as to output a first test address pattern to the first scan path, a second shift register for storing second column address data therein so as to output a second test address pattern to the second scan path, and write signal generating means for generating a write signal for the memory cell array in association with the first and second test address patterns on the basis of at least data stored in registers in the first and second shift registers; and the first scan path being constructed such that a less significant bit of the first row address data is stored in a position closer to an input terminal of the first scan path than a more significant bit thereof, the second scan path being constructed such that a less significant bit of the first column address data is stored in a position closer to an input terminal of the second scan path than a more significant bit thereof, the first shift register being constructed such that a less significant bit of the second row address data is stored in a position closer to an input terminal of the first shift register than a more significant bit thereof, the second shift register being constructed such that a less significant bit of the second column address data is stored in a position closer to an input terminal of the second shift register than a more significant bit thereof, wherein write data are written to the memory cell array in each of the plurality of memory circuits according to the first and second test address patterns and the write signal.

It is therefore an object of the present invention to share an address generator circuit between memory circuits having different memory cell array structures, or different X and Y address structures, to reduce the area occupied by the address generator circuit within a semiconductor memory device for generating addresses for a memory test.

These and other objects, features, aspects and advantages of the present invention will become more apparent from the following detailed description of the present invention when taken in conjunction with the accompanying drawings.

BRIEF DESCRIPTION OF THE DRAWINGS

FIG. 17 conceptually shows the checker board pattern written to the memory cell array of FIG. 16.

DESCRIPTION OF THE PREFERRED EMBODIMENTS

Figure 14:
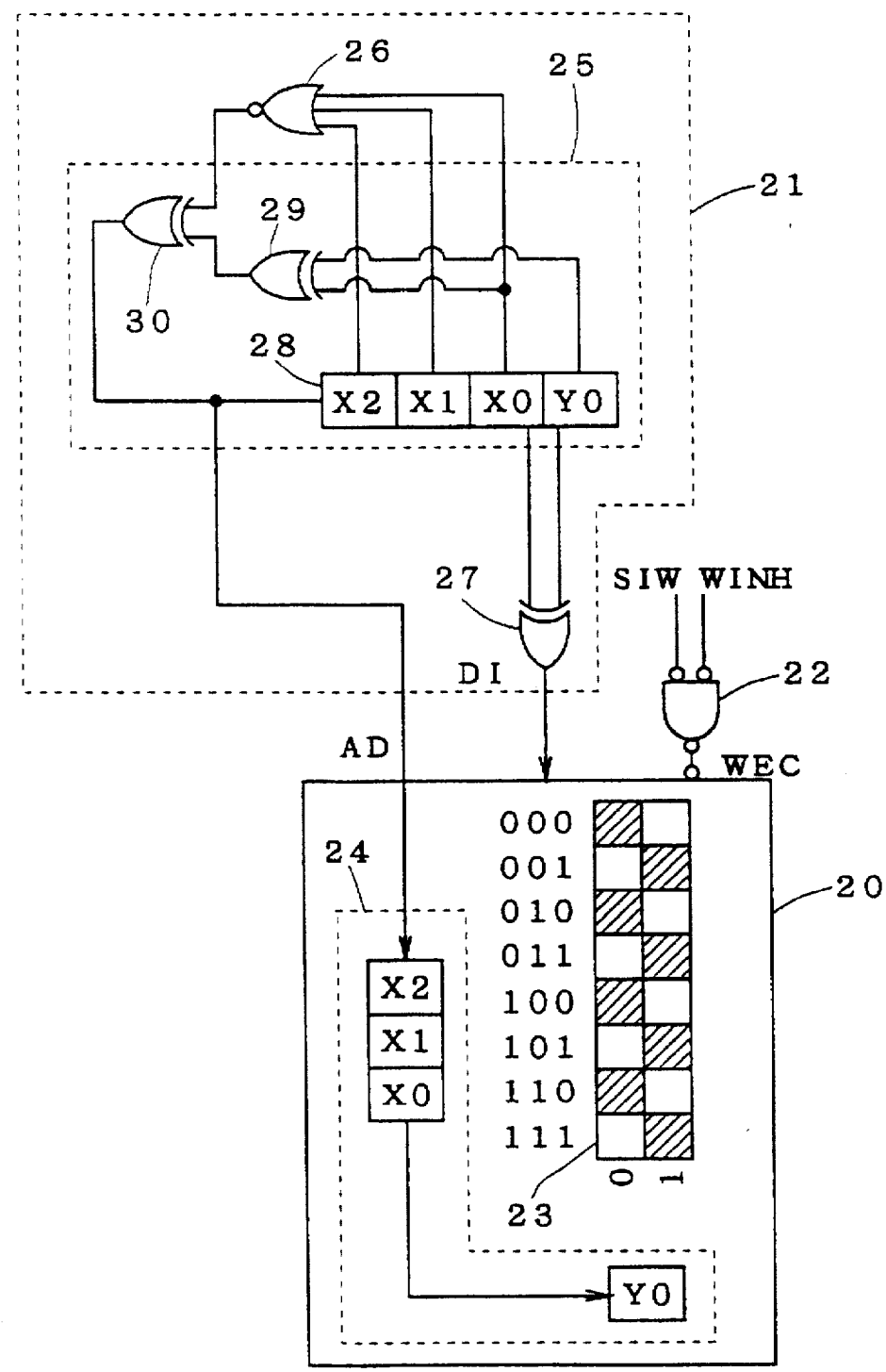
FIG. 14 illustrates the address generator circuit for use in the present invention.

An address generator circuit according to the present invention will now be described. FIG. 14 is a block diagram of the address generator circuit to illustrate the relation between the address generator circuit and a memory circuit wherein a checker board pattern which is a typical test pattern for a RAM that is one of the memory circuits is written to the RAM by using the address generator circuit.

In FIG. 14, the reference numeral 20 designates a RAM, 21 designates an address generator circuit for generating address data AD and write data DI to be applied to the RAM 20 during testing, and 22 designates an OR gate for generating a write control signal WEC for the RAM 20 from a SIW signal and a write inhibit signal WINH. The RAM 20 writes the data DI to a memory cell array 23 when the write control signal WEC=0. The RAM 20 shown in FIG. 14 is designed by using the DFT (design for testability) technique and comprises a scan path 24 for addresses so as to serially receive the address data generated by the address generator circuit 21 when the test is executed. The RAM 20 may be controlled by the write control signal WEC to prevent the write operation to the RAM 20 by mistake during a logic test.

The address generator circuit 21 comprises a linear feedback shift register (referred to hereinafter as an LFSR) 25, an NOR gate 26 for causing the LFSR 25 to output "0000", and an exclusive-OR circuit (referred to hereinafter as an XOR gate) 27 serving as a write data generating means for generating the write data DI in response to predetermined bit values stored in a shift register 28 of the LFSR 25.

The LFSR 25 includes, as well as the 4-bit shift register 28, an XOR gate 29 for performing a non-equivalence Boolean operation of an output Y0 from a register in the last stage of the shift register 28 and an output X0 from a register in the previous stage thereof to output the operation result, and an XOR gate 30 for outputting the exclusive-OR of the output from the XOR gate 29 and the output from the NOR gate 26 to a register in the first stage of the shift register 28.

The NOR gate 26 outputs the NOR of the outputs from all registers of the shift register 28 but the last one.

Although not shown, the shift register 28 and scan path 24 operate in response to a clock. Table 1 shows data sequentially stored is the shift register 28 in response to the clock when the initial data stored therein is "0000".

TABLE 1

|    | A3 | A2 | A1 | A0 |
|----|----|----|----|----|
| 0  | 0  | 0  | 0  | 0  |
| 1  | 1  | 0  | 0  | 0  |
| 2  | 0  | 1  | 0  | 0  |
| 3  | 0  | 0  | 1  | 0  |
| 4  | 0  | 0  | 0  | 1  |
| 5  | 1  | 1  | 0  | 0  |
| 6  | 0  | 1  | 1  | 0  |
| 7  | 1  | 0  | 1  | 1  |
| 8  | 0  | 1  | 0  | 1  |
| 9  | 1  | 0  | 1  | 0  |
| 10 | 1  | 1  | 0  | 1  |
| 11 | 1  | 1  | 1  | 0  |
| 12 | 1  | 1  | 1  | 1  |
| 13 | 0  | 1  | 1  | 1  |
| 14 | 0  | 0  | 1  | 1  |
| 15 | 0  | 0  | 0  | 1  |

The output from the XOR gate 30 of the address generator circuit 21 is used as the address data AD. The XOR gate 27 performs the exclusive-OR operation of the output Y0 from the last register of the shift register 28 and the output X0 from the previous register thereof to output the write data DI to the RAM 20.

The address generator circuit 21 shown in FIG. 14 shifts the generated address data AD into the scan path 24 for addresses, permitting pseudo-random addressing for the RAM 20.

The algorithm of the write operation of the checker board pattern to the RAM is discussed below.

First, the SIW signal=0, the write inhibit signal WINH=0, and the write control signal WEC=1. The RAM 20 is permitted to write the received write data DI to the memory cell array 23 when the write control signal WEC is "0".

The initial data of the shift register 28 are "0000". The same data ("0000" herein) are set as the initial data to the scan path 24 of the RAM 20 which is a circuit to be tested. By such setting, the data stored in the shift register 28 of the address generator circuit 21 match the data stored in the scan path 24 of the RAM 20 in the initial state of operation and indicate the address of the RAM 20.

The least significant bit of an X address (or row address) is represented as X(0), and the least significant bit of a Y address (or column address) is represented as Y(0). The value of the write data DI is represented by DATA0 and DATA1. One of these represented data are obtained by the NOT operation of the other.

To write the checker board pattern to the RAM 20, the following rules (i) and (ii) must be followed:

(i) DATA0 is written to an address which satisfies X0 exor Y0=0

(ii) DATA1 is written to an address which satisfies Y0 exor X0=1 where exor is an operator indicative of the exclusive-OR operation.

The write data DI are generated in accordance with the rules (i) and (ii) by the address generator circuit 21 shown in FIG. 14. It is apparent that the checker board pattern may be written to the memory cell array 23 by the address generator circuit 21.

In the memory cell array of FIG. 14, if "0" is written to the shaded sections, DATA0 and DATA1 correspond respectively to "0" and "1.". Then, the rules (i) and (ii) are translated into:

(i') "0" is written to the address which satisfies X0 exor Y0=0

(ii') "1" is written to the address which satisfies X0 exor Y0=1

The rules for writing a row bar pattern to the RAM 20 are:

(iii) DATA0 is written to an address which satisfies X0=0

(iv) DATA1 is written to an address which satisfies X0=1

The rules for writing a column bar pattern to the RAM 20 are:

(v) DATA0 is written to an address which satisfies Y0=0

(vi) DATA1 is written to an address which satisfies Y0=1

The address generator circuit 21 shown in FIG. 14 includes the LFSR 25, permitted to have a more simple construction and to operate at higher speeds than that including a counter.

First Preferred Embodiment

Figure 1:
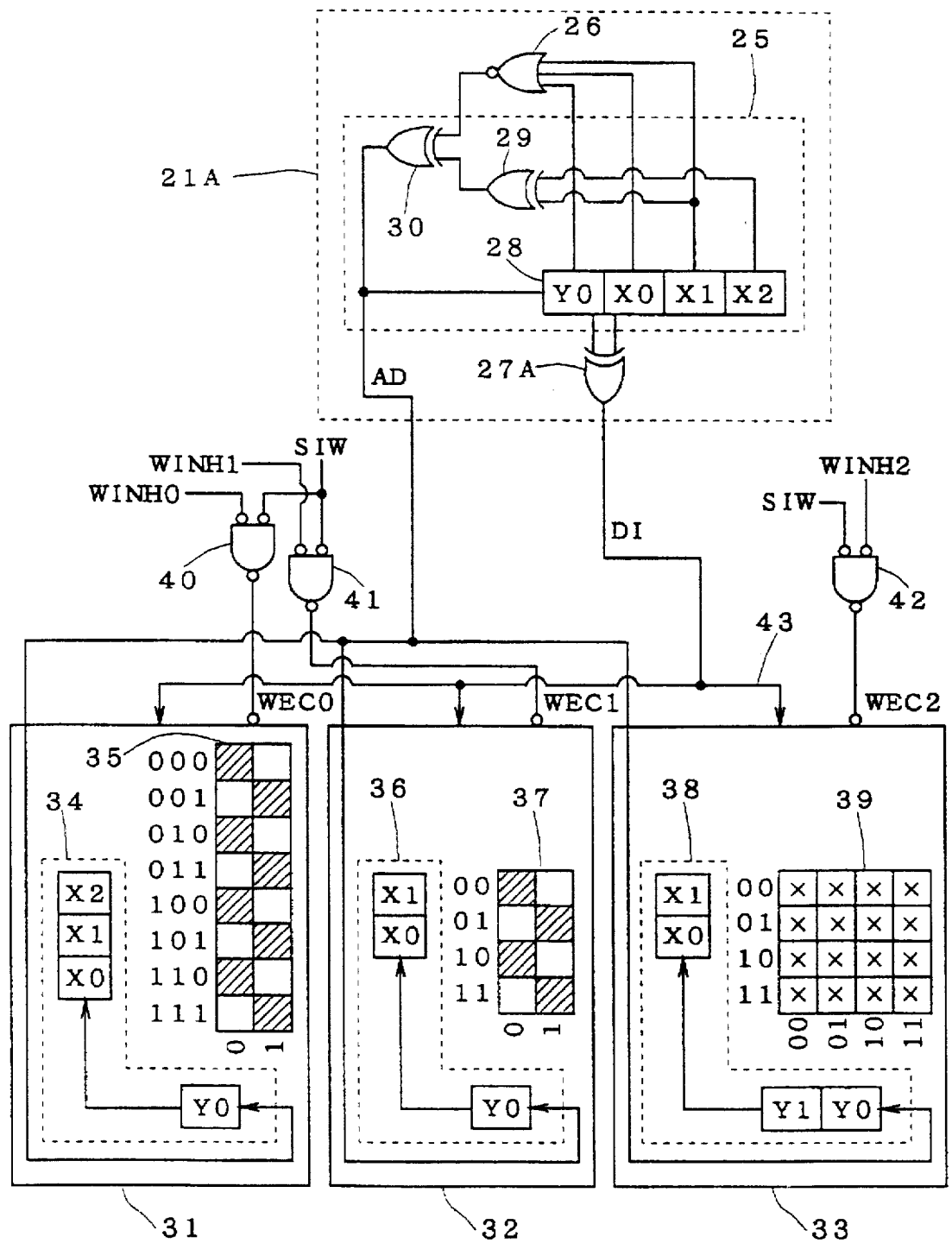
FIGS. 1 and 2 are block diagrams of address generator circuits writing a checker board pattern according to a first preferred embodiment of the present invention.
Figure 2:
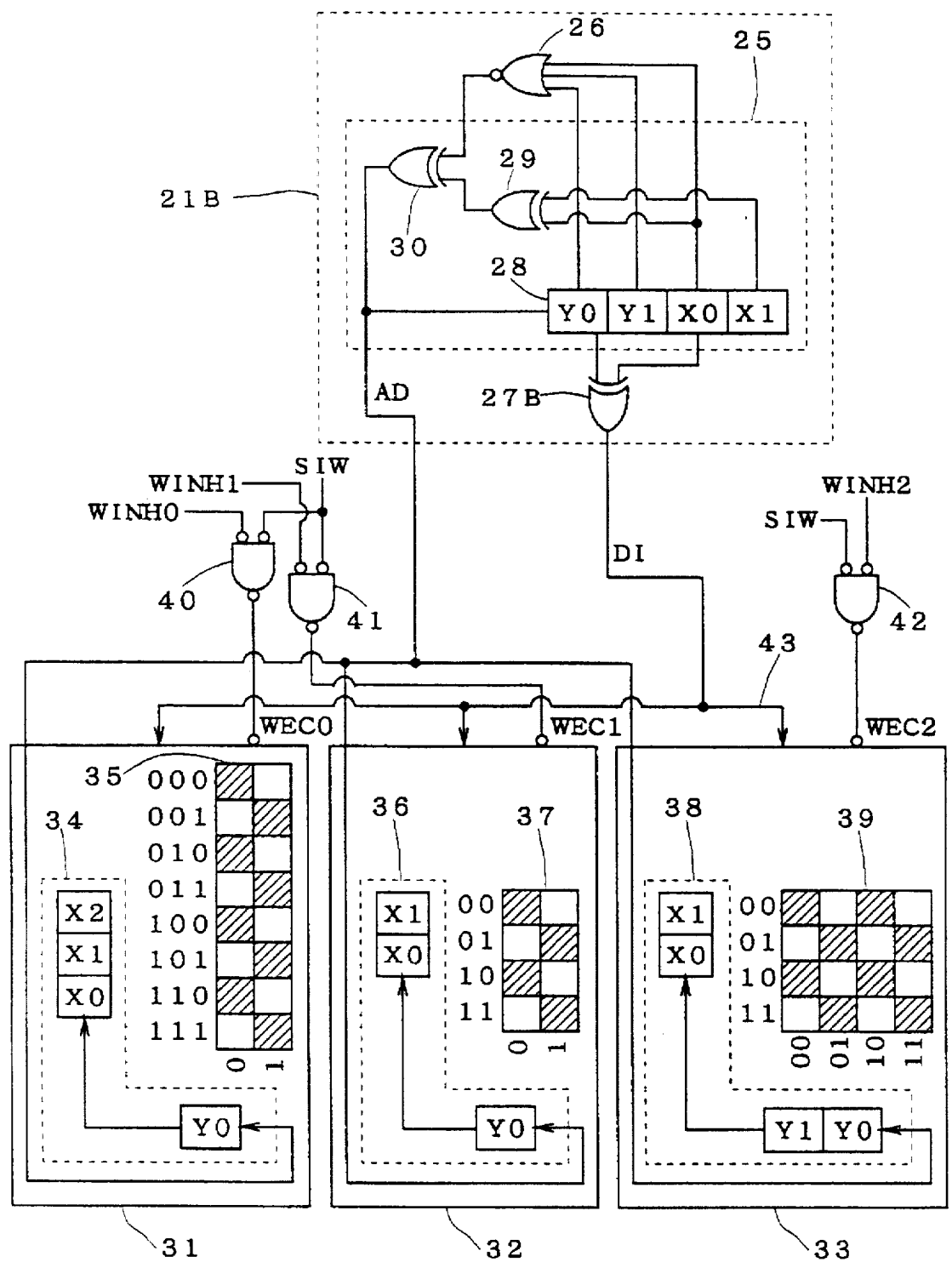

A first preferred embodiment according to the present invention is described below. FIGS. 1 and 2 are block diagrams of a semiconductor memory device according to the first preferred embodiment to illustrate the write operation of the checker board pattern. One semiconductor memory device is shown in FIGS. 1 and 2 wherein attention is focused on memory circuits and circuits for writing a pattern.

In FIGS. 1 and 2, the reference character 21A designates an address generator circuit for generating an address pattern and the write data DI for memory cell arrays during testing so as to write the checker board pattern; 21B designates an address generator circuit for generating an address pattern and the write data DI for the memory cell arrays during testing so as to write the checker board pattern; 31 to 33 designate RAMs having different memory cell array structures; and 40 to 42 designate OR gates corresponding respectively to the RAMs 31 to 33 for generating the write control signal WEC from the SIW signal and write inhibit signals WINH0 to WINH2 to output the write control signal WEC.

The RAM 31 includes a memory cell array 35, and a scan path 34 for indicating the address for the memory cell array 35. Serially applied data are stored in the scan path 34 so that the data sequence from an input terminal of the scan path 34 is the bit Y0 (where the bit Y0 is stored in α registers, where α in this instance corresponds to a 1 bit capacity) to be applied to a Y decoder of the memory cell array 35, the least significant bit X0 to be applied to an X decoder thereof, the second least significant bit X1 to be applied to the X decoder, and the most significant bit X2 to be applied to the X decoder (where the bits X0, X1, and X2 are stored in β registers, where β in this instance corresponds to a 3 bit capacity).

The RAM 32 includes a memory cell array 37, and a scan path 36 for indicating the address for the memory cell array 37. Serially applied data are stored in the scan path 36 so that the data sequence from an input terminal of the scan path 36 is the bit Y0 (where the bit Y0 is stored in α registers, where α in this instance corresponds to a 1 bit capacity) to be applied to a Y decoder of the memory cell array 37, the least significant bit X0 to be applied to an X decoder thereof, and the most significant bit X1 to be applied to the X decoder (where the bits X0, and X1 are stored in γ registers, where γ in this instance corresponds to a 2 bit capacity).

The RAM 33 includes a memory cell array 39, and a scan path 38 for indicating the address for the memory cell array 39. Serially applied data are stored in the scan path 38 so that the data sequence from an input terminal of the scan path 38 is the least significant bit Y0 to be applied to a Y decoder of the memory cell array 39, the most significant bit Y1 to be applied to the Y decoder (where the bits Y0, and Y1 are stored in δ registers, where δ in this instance corresponds to a 2 bit capacity), the least significant bit X0 to be applied to an X decoder thereof, and the most significant bit X1 to be applied to the X decoder (where the bits X0, and X1 are stored in ε registers, where ε in this instance corresponds to a 2 bit capacity. The convention of using Greek letters to differentiate between registers and to define the bit capacity of the registers may be applied to the other Figures as well).

The address generator circuit 21A includes the LFSR 25, the NOR gate 26 for causing the LFSR 25 to output "0000", and an XOR gate 27A serving as a write data generating means for generating the write data DI in response to predetermined bit values stored in the shift register 28 of the LFSR 25.

The address generator circuit 21B includes the LFSR 25, the NOR gate 26 for causing the LFSR 25 to output "0000", and an XOR gate 27B serving as a write data generating means for generating the write data DI in response to predetermined bit values stored in the shift register 28 of the LFSR 25.

The LFSRs 25 shown in FIGS. 1 and 2 are similar in construction to the LFSR 25 of FIG. 14. The relation between the LFSRs 25 and NOR gates 26 of FIGS. 1 and 2 is similar to that between the LFSR 25 and NOR gate 26 of FIG. 14. The 1-bit data stored in respective registers of the shift register 28 of the address generator circuit 21A are indicated as Y0, X0, X1, X2 in sequential order from the input terminal thereof. The 1-bit data stored in respective registers of the shift register 28 of the address generator circuit 21B are indicated as Y0, Y1, X0, X1 in sequential order from the input terminal thereof.

The XOR gate 27A serving as the write data generating means for generating the write data DI in the address generator circuit 21A is adapted to output the exclusive-OR of the data Y0 stored in the register closest to the input terminal of the shift register 28 and the data X0 stored in the next-stage register thereof. The use of the XOR gate 27 simplifies the circuit arrangement. The write data DI outputted from the XOR gate 27A are transmitted through a signal line 43 connected commonly to the RAMs 31 to 33.

The memory cell arrays 35, 37, 39 of the RAMs 31 to 33 are in the forms of an 8×2 matrix, a 4×2 matrix, and a 4×4 matrix, respectively. The X and Y addresses for specifying a desired memory cell in the memory cell array 35 are 3 bits and 1 bit in length, respectively. The X and Y addresses for specifying a desired memory cell in the memory cell array 37 are 2 bits and 1 bit in length, respectively. The X and Y addresses for specifying a desired memory cell in the memory cell array 39 are 2 bits and 2 bits in length, respectively.

The scan paths 34, 36, 38 are commonly connected to the output terminal of the XOR gate 30 and receive the same data. However, since the memory cell arrays 35, 37, 39 are of different constructions for each RAM, the outputs from the respective registers of the scan paths 34, 36, 38 are distributed to the X and Y decoders so as to conform to the structures of the memory cell arrays 35, 37, 39.

The memory cell arrays 35 and 37 of the RAMs 31 and 32 of FIG. 1 are different in the number of rows but equal in the number of columns. Thus, to write the checker board pattern to the memory cell arrays 35 and 37 simultaneously by using the address pattern outputted from the address generator circuit 21A, the data Y0 of the register closest to the input terminal in the scan paths 34 and 36 are applied to the Y decoder, and the data X0 of the next-stage register is assigned to the least significant bit of the X decoder.

To write the checker board pattern, the SIW signal is initially set to "0" and the write inhibit signals WINH0=0, WINH1=0, and WINH2=1, thereby enabling the write operation of the RAMs 31 and 32 and disabling the write operation of the RAM 33. In this state, the write data DI and the address pattern are fed from the XOR gate 27A to the RAMs 31 to 33. Then, "1" is written to the cells wherein the least significant bits of the X and Y addresses in the memory cell arrays 35, 37 are different, and "0" is written to the cells wherein the least significant bits of the X and Y addresses are equal. Upon completion of the write operation in this manner, the RAMs 31 and 32 have the checker board patterns of FIG. 1 written thereto. In FIGS. 1 and 2, the shaded cells indicate cells to which "0" has been written, the blank cells indicate cells to which "1" has been written, and the cells with crosses indicate cells in an indeterminate state.

With the SIW signal held at "0", the write inhibit signals WINH0=1, WINH1=1 and WINH2=0, and the write signal DI is fed from the XOR gate 27B of FIG. 2 to the RAM 33. Then, "1" is written to the cells wherein the least significant bits of the X and Y addresses in the memory cell array 39 are different, and "0" is written to the cells wherein the least significant bits of the X and Y addresses are equal. Upon completion of the write operation in this manner, the RAM 33 has the checker board pattern of FIG. 2 written thereto.

Although not shown, a selector or the like performs switching between the address generator circuits 21A, 21B connected to the signal line 43. Since the address generator circuits 21A and 21B differ only in connections between the input terminals of the XOR gates 27A, 27B and the shift register 28, the connections may be switched by a selector for switching between the address generator circuits 21A and 21B.

As illustrated in FIG. 1, the least significant bit of the Y address is allocated to the register closest to the input terminal of the scan path, the Y address is allocated to a position closer to the input terminal than the X address, and the less significant bits of the X and Y addresses are allocated to the registers closer to the input terminal than the more significant bits. Thus, in the RAMs having the same number of Y addresses, the registers to which the least significant bit of the X address is allocated are located in the same position counted from the input terminal. Therefore, the registers for storing the least significant bit X0 of the X address and the least significant bit Y0 of the Y address in the shift register of the address generator circuit are common to these memory circuits. The exclusive-OR of the values stored in the registers corresponding to the least significant bits X0 and Y0 of the X and Y addresses in the shift register may be used as the write data DI and applied to these memory circuits to simultaneously write the checker board pattern to the memory circuits. The address generator circuit generates the address pattern in accordance with the memory circuit having a greater number of X addresses.

Figure 18:
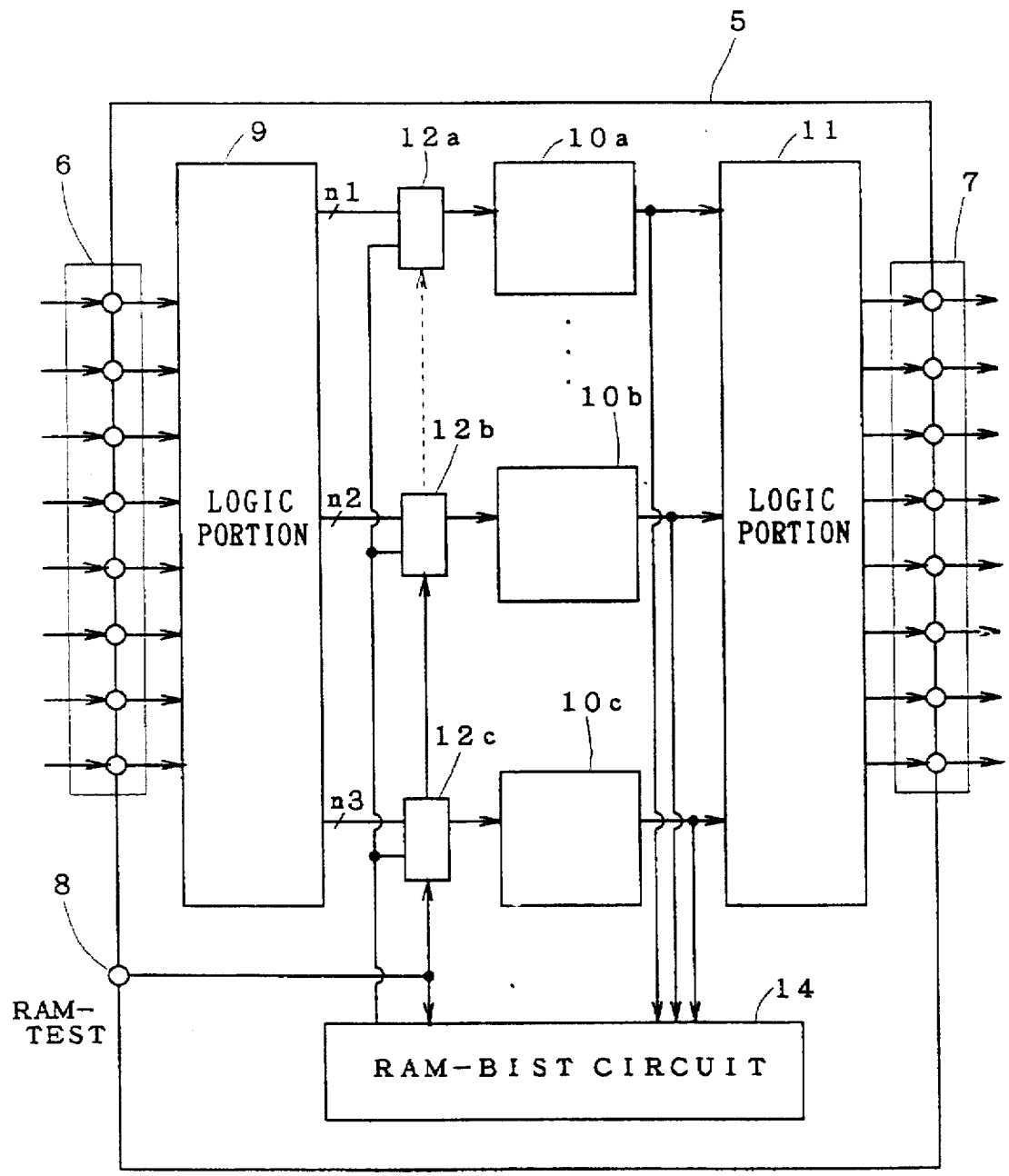
FIG. 18 is a block diagram of a semiconductor memory device including a built-in memory test circuit.

The two address generator circuits 21A and 21B shown in FIGS. 1 and 2 can write the checker board pattern to the three RAMs 31 to 33. This reduces the number of address generator circuits and the area occupied by the RAM-BIST circuit 14 of FIG. 18.

The write control signal WEC may control the write permission/inhibition of the RAMs 31 to 33 to share the signal line for feeding the write data DI between the RAMs 31 to 33, improving the level of integration.

The address generator circuit employs the LFSR in this preferred embodiment since it provides a more simple circuit arrangement than the address generator circuit employing a counter, further reducing the area occupied by the address generator circuit.

The present invention is applicable to a memory circuit other than the RAM, for example, to an EPROM, an EEPROM, or the like.

Figure 3:
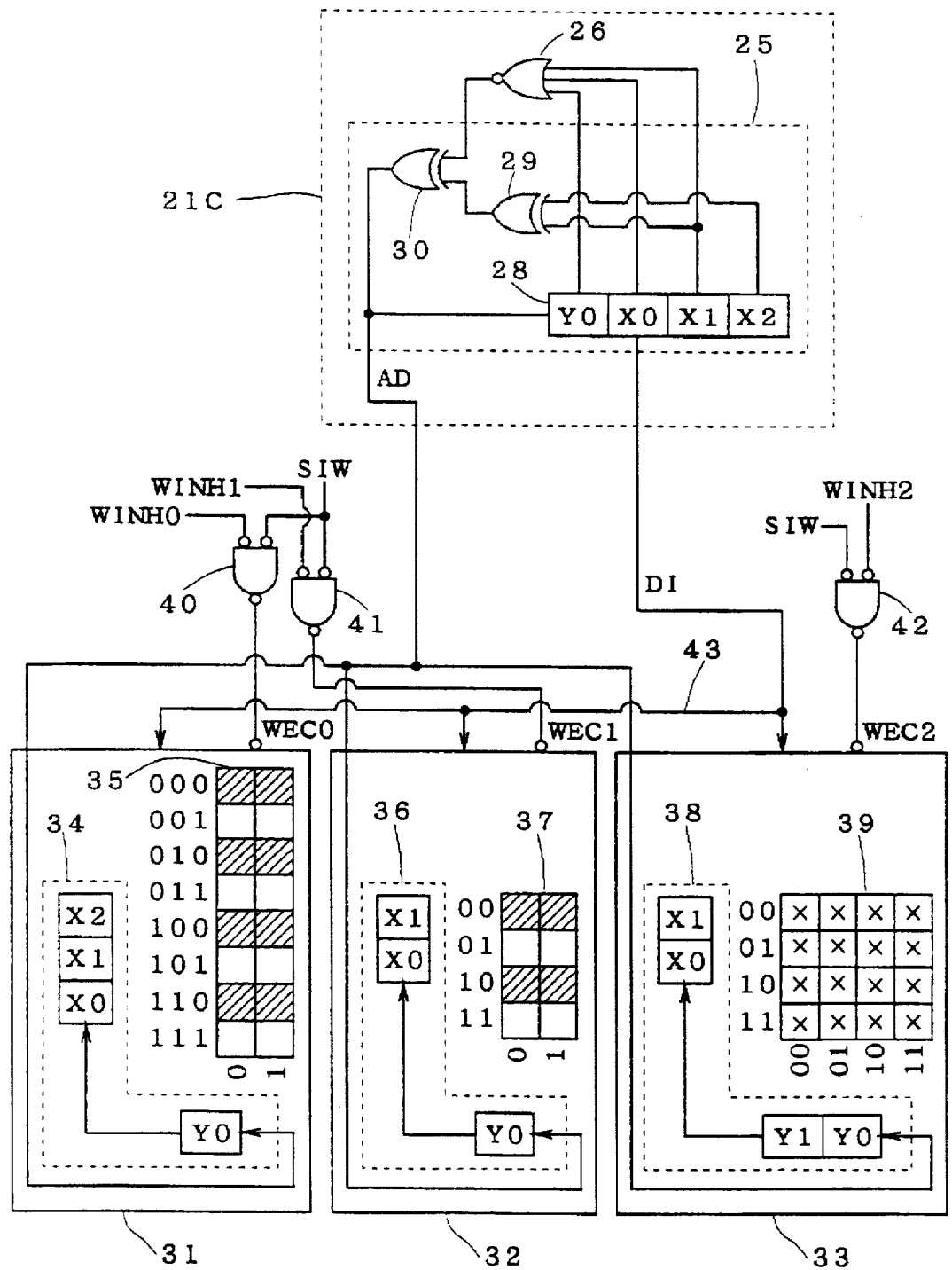
FIGS. 3 and 4 are block diagrams of address generator circuits writing a row bar pattern according to the first preferred embodiment of the present invention.
Figure 4:
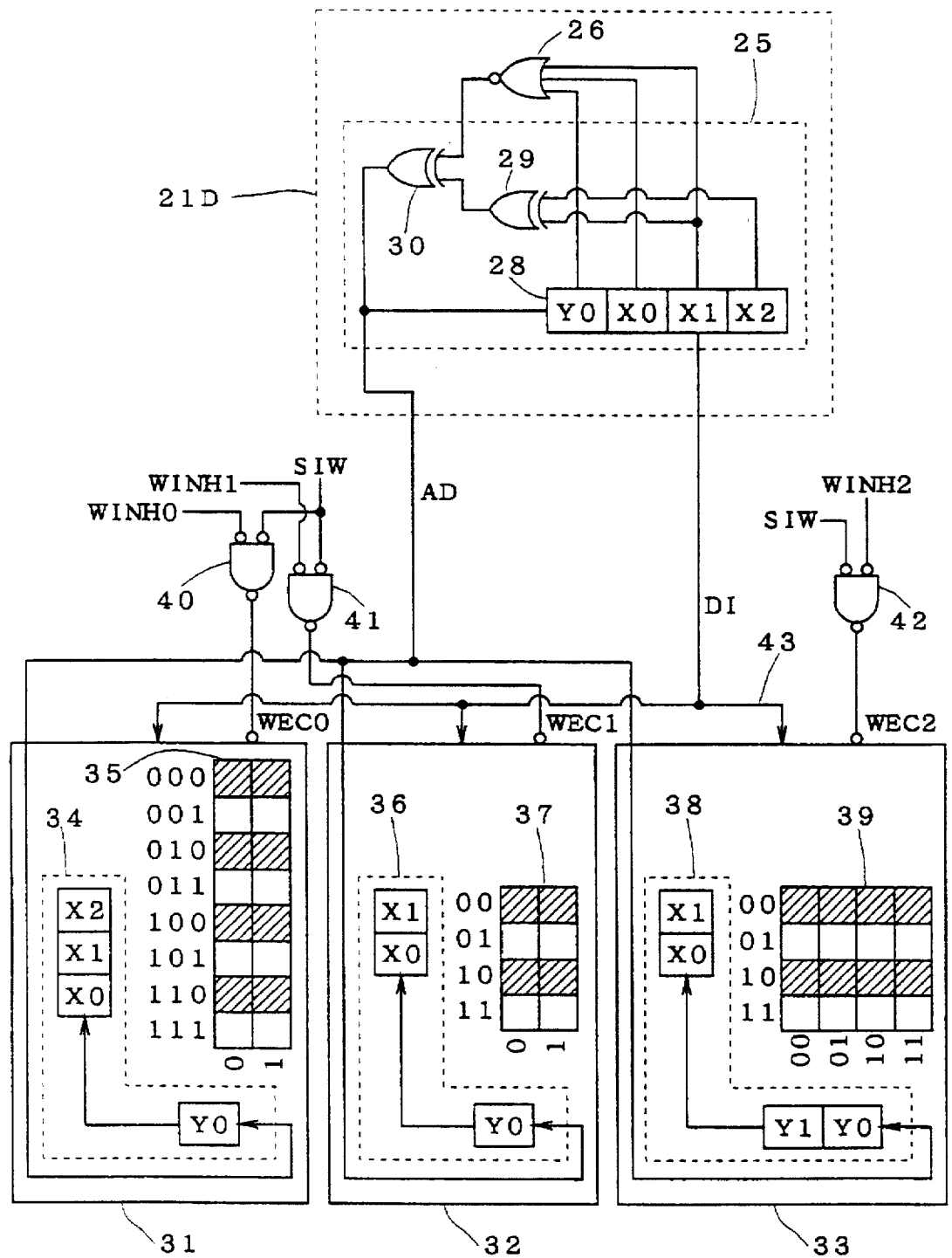

Referring to FIGS. 3 and 4, writing the row bar pattern to the RAMs 31 to 33 by address generator circuits including the LFSR 25 and NOR gate 26 is described below.

As illustrated in FIGS. 3 and 4, each address generator circuit 21C and 21D comprises the LFSR 25 and the NOR gate 26 for causing the LFSR 25 to output "0000". The write data DI for writing the row bar pattern to the RAMs 31 and 32 are stored in a register in the second position from the input terminal of the shift register 28 in the address generator circuit 21C. The write data DI for writing the row bar pattern to the RAM 33 are stored in a register in the third position from the input terminal of the shift register 28 in the address generator circuit 21D. For these reasons, the address generator circuits 21C and 21D do not comprise a logic device equivalent to the XOR gate 27A of FIG. 1 and the XOR gate 27B of FIG. 2.

To write the row bar pattern to the RAMs 31 and 32, the SIW signal is initially set to "0", and the write inhibit signals WINH0=0, WINH1=0, and WINH2=1, thereby enabling the write operation of the RAMs 31 and 32 and disabling the write operation of the RAM 33. In this state, the write data DI and the address pattern are fed from the second register of the shift register 28 in the address generator circuit 21C to the RAMs 31 to 33. In the memory cell arrays 35 and 37, "1" is written to the cells wherein the second most significant bit of the X address is "1", and "0" is written to the other cells. Upon completion of the write operation in this manner, the RAMs 31 and 32 have the row bar patterns of FIG. 3 written thereto.

To write the row bar pattern to the RAM 33, the SIW signal is initially set to "0", and the write inhibit signals WINH0=0 and WINH2=1. The write data DI and the address pattern are fed to from the third register of the shift register 28 in the address generator circuit 21D to the RAMs 31 to 33. In the memory cell array 39, "1" is written to the cells wherein the second most significant bit of the X address is "1", and "0" is written to the other cells. Upon completion of the write operation in this manner, the RAM 33 has the row bar pattern of FIG. 4 written thereto.

Figure 5:
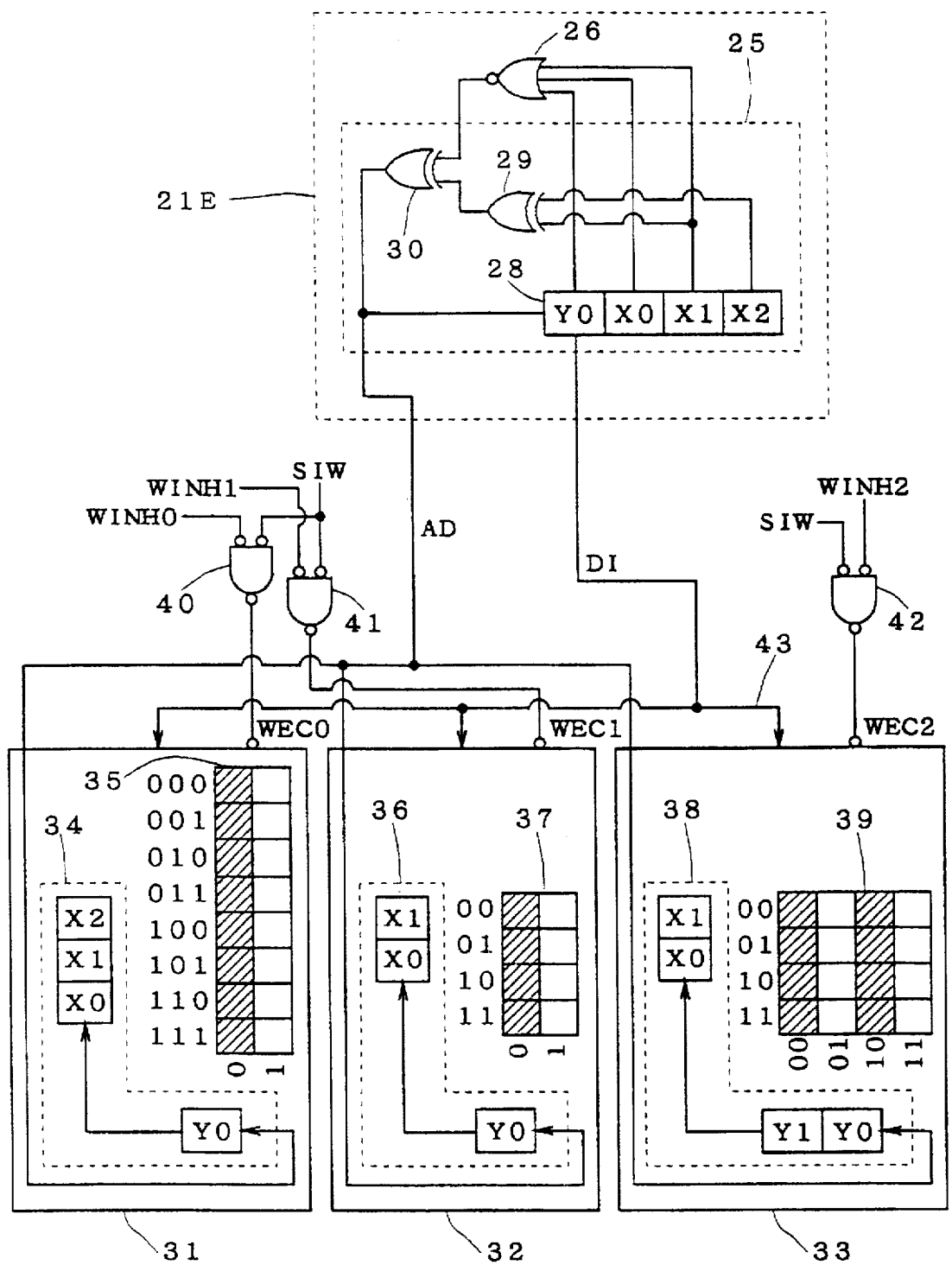
FIG. 5 is a block diagram of an address generator circuit writing a column bar pattern according to the first preferred embodiment of the present invention.

Referring to FIG. 5, writing the column bar pattern to the RAMs 31 to 33 by an address generator circuit including the LFSR 25 and NOR gate 26 is described below.

As illustrated in FIG. 5, an address generator circuit 21E comprises the LFSR 25 and the NOR gate 26 for causing the LFSR 25 to output "0000". The write data DI for writing the column bar pattern to the RAMs 31 to 33 are stored in a register in the first position of the shift register 28. For this reason, the address generator circuit 21E does not comprise a logic device equivalent to the XOR gate 27A of FIG. 1 and the XOR gate 27B of FIG. 2.

To write the column bar pattern to the RAMs 31 to 33, the SIW signal is initially set to "0", and the write inhibit signals WINH0=0, WINH1=0, and WINH2=0, thereby enabling the write operation of the RAMs 31 to 33. In this state, the write data DI and the address pattern are fed from the first register of the shift register 28 to the RAMs 31 to 33. In the memory cell arrays 35, 37 and 39, "1" is written to the cells wherein the least significant bit of the Y address is "1", and "0" is written to the other cells. Upon completion of the write operation in this manner, the RAMs 31 to 33 have the column bar patterns of FIG. 5 written thereto.

Although the memory cell arrays have the same number of columns in the above described form, the memory cell arrays having the same number of rows similarly allow the size reduction of the RAM-BIST circuit 14.

Figure 6:
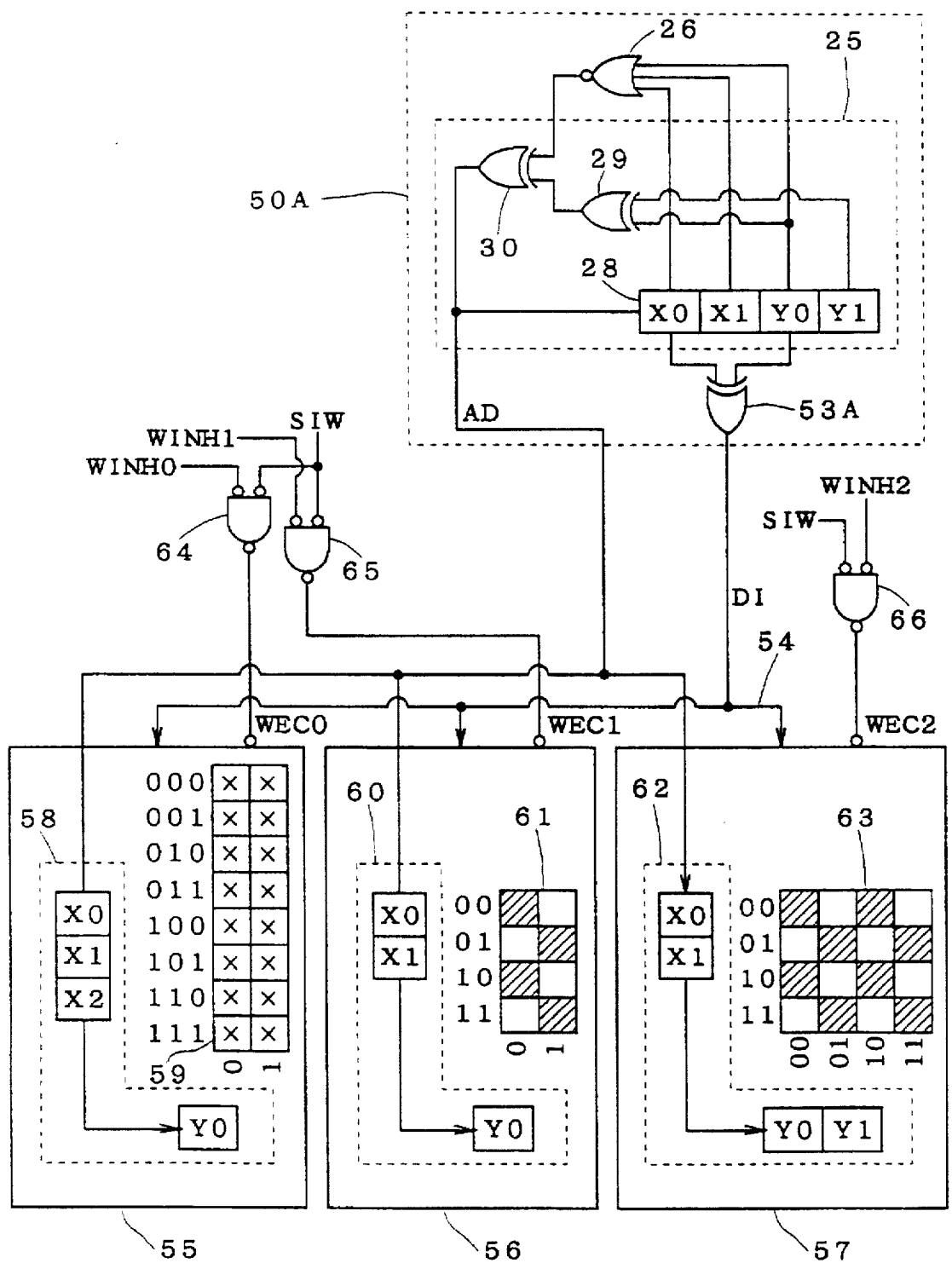
FIGS. 6 and 7 are block diagrams of the address generator circuits writing the checker board pattern according to another form of the first preferred embodiment of the present invention.
Figure 7:
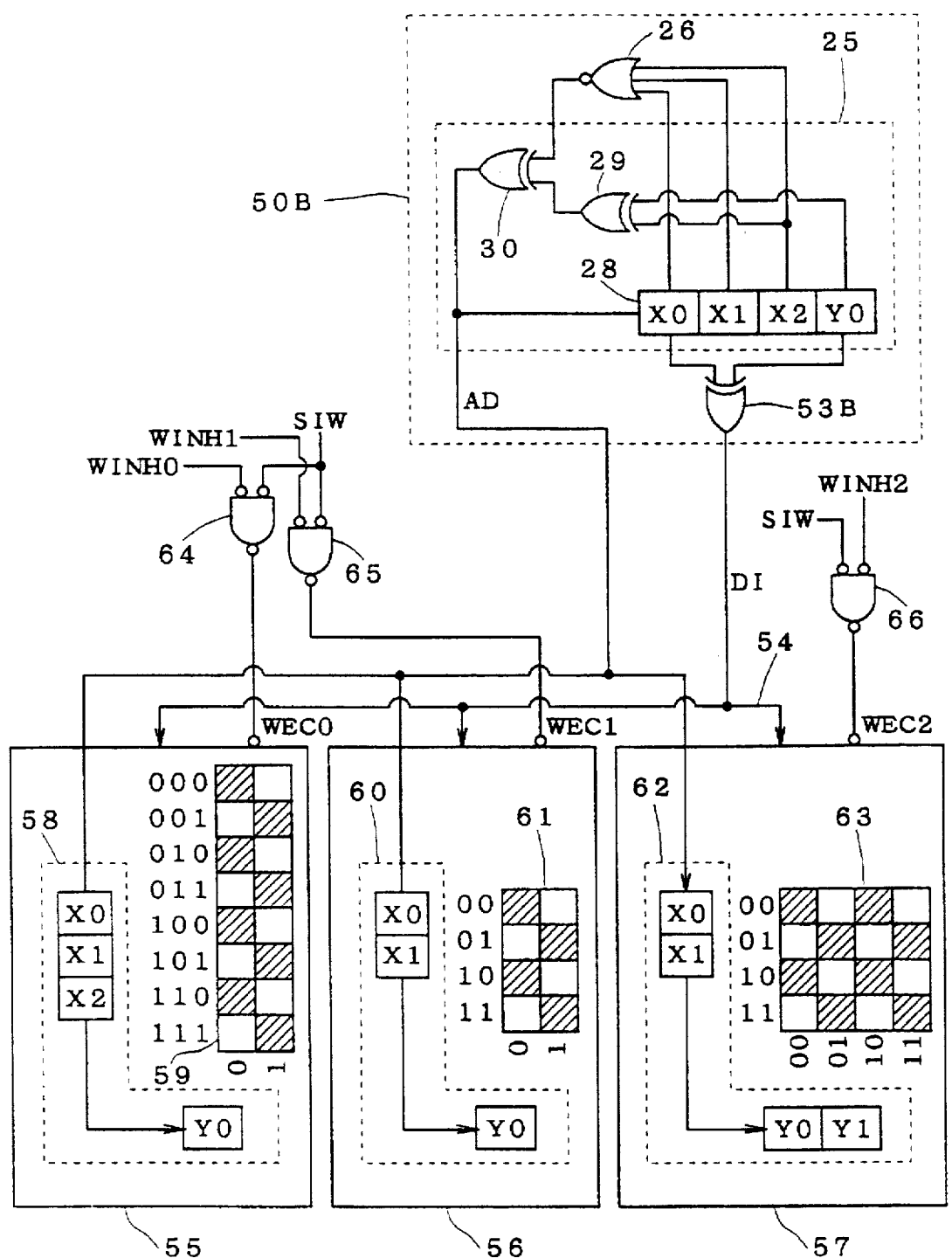

FIGS. 6 and 7 are block diagrams of the semiconductor memory device according to another form of the first preferred embodiment.

In FIGS. 6 and 7, the reference character 50A designates an address generator circuit for generating the address pattern and the write data DI for the memory cell arrays during testing so as to write the checker board pattern; 50B designates an address generator circuit for generating the address pattern and the write data DI for the memory cell arrays during testing so as to write the checker board pattern; 55 to 57 designate RAMs having different memory cell array structures; and 64 to 66 designate OR gates corresponding respectively to the RAMs 55 to 57 for generating the write control signal WEC from the SIW signal and write inhibit signals WINH0 to WINH2 to output the write control signal WEC.

The RAM 55 includes a memory cell array 59 and a scan path 58 for indicating the address for the memory cell array 59. Serially applied data are stored in the scan path 58 so that the data sequence from an input terminal of the scan path 58 is the least significant bit X0 to be applied to an X decoder of the memory cell array 59, the second least significant bit X1 to be applied to the X decoder, the most significant bit X2 to be applied to the X decoder, and the bit Y0 to be applied to a Y decoder thereof.

The RAM 56 includes a memory cell array 61 and a scan path 60 for indicating the address for the memory cell array 61. Serially applied data are stored in the scan path 60 so that the data sequence from an input terminal of the scan path 60 is the least significant bit X0 to be applied to an X decoder of the memory cell array 61, the most significant bit X1 to be applied to the X decoder, and the bit Y0 to be applied to a Y decoder thereof.

The RAM 57 includes a memory cell array 63 and a scan path 62 for indicating the address for the memory cell array 63. Serially applied data are stored in the scan path 62 so that the data sequence from an input terminal of the scan path 62 is the least significant bit X0 to be applied to an X decoder of the memory cell array 63, the most significant bit X1 to be applied to the X decoder, the least significant bit Y0 to be applied to a Y decoder thereof, and the most significant bit Y1 to be applied to the Y decoder.

The address generator circuit 50A comprises the LFSR 25, the NOR gate 26, and an XOR gate 53A serving as a write data generating means for generating the write data DI in response to predetermined bit values stored in the shift register 28 of the LFSR 25.

The address generator circuit 50B comprises the LFSR 25, the NOR gate 26, and an XOR gate 53B serving as a write data generating means for generating the write data DI in response to predetermined bit values stored in the shift register 28 of the LFSR 25.

To write the checker board pattern, the write inhibit signals WINH0 to WINH2 initially disable the write operation of the RAM 55 and enable the write operation of the RAMs 56 and 57. The address generator circuit 50A writes the checker board pattern to the RAMs 56 and 57. Then, the write inhibit signals WINH0 to WINH2 enable the write operation of the RAM 55 and disable the write operation of the RAMs 56 and 57. The address generator circuit 50B writes the checker board pattern to the RAM 55. Although not shown, a selector, for example, performs switching between the address generator circuits 50A, 50B connected to a signal line 54.

Writing the column bar pattern to the RAMs 55 to 57 by an address generator circuit including the LFSR 25 and NOR gate 26 is described below with reference to FIGS. 8 and 9.

Figure 8:
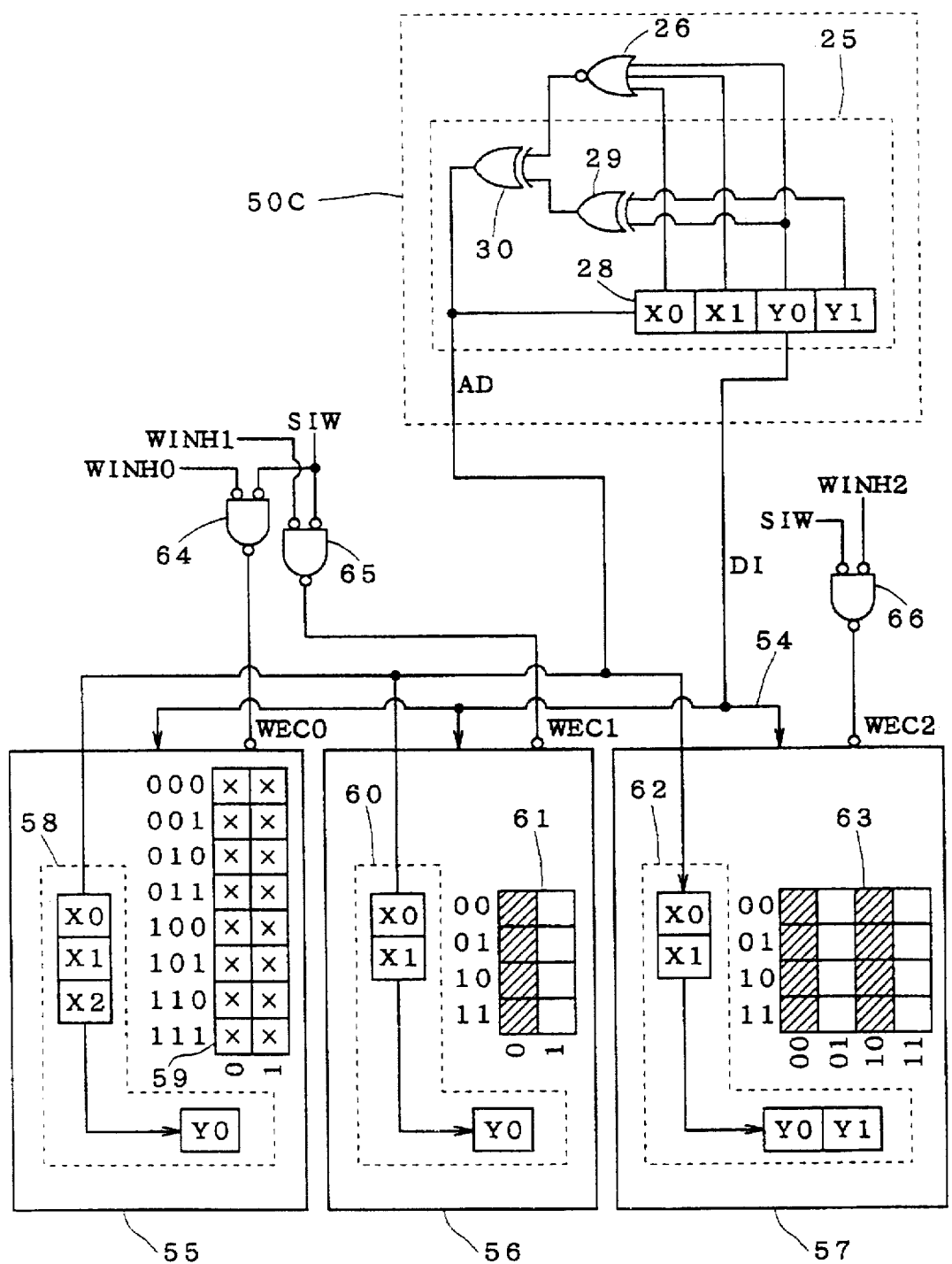
FIGS. 8 and 9 are block diagrams of the address generator circuits writing the column bar pattern according to another form of the first preferred embodiment of the present invention.

Referring to FIG. 8, an address generator circuit 50C comprises the LFSR 25 and the NOR gate 26. The write data DI are stored in the third register of the shift register 28. Like reference numerals and characters are used in FIG. 8 to designate parts identical with or corresponding to those of FIG. 6.

Figure 9:
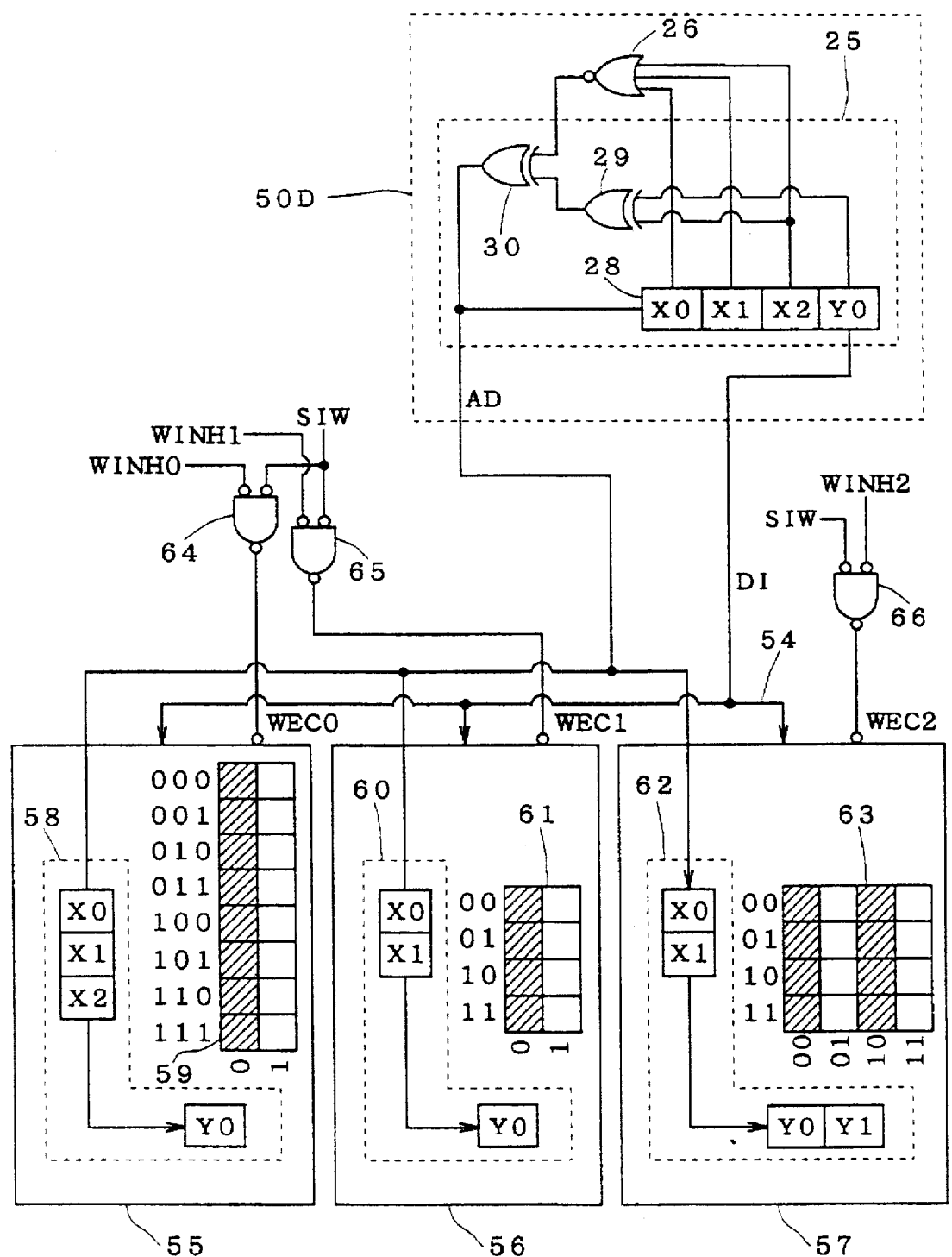

Referring to FIG. 9, an address generator circuit 50D comprises the LFSR 25 and the NOR gate 26. The write data DI are stored in the last register of the shift register 28. Like reference numerals and characters are used in FIG. 9 to designate parts identical with or corresponding to those of FIG. 7.

To write the column bar pattern, the write inhibit signals WINH0 to WINH2 initially disable the write operation of the RAM 55 and enable the write operation of the RAMs 56 and 57. The address generator circuit 50C writes the column bar pattern to the RAMs 56 and 57. The state when the write operation is completed is shown in FIG. 8. Then, the write inhibit signals WINH0 to WINH2 enable the write operation of the RAM 55 and disable the write operation of the RAMs 56 and 57. The address generator circuit 50D writes the column bar pattern to the RAM 55. The state when the write operation is completed is shown in FIG. 9. Although not shown, a selector, for example, performs switching between the address generator circuits 50C, 50D connected to the signal line 54.

Second Preferred Embodiment

In the first preferred embodiment, the address generator circuit fixes the SIW signal to "0" and changes the write data DI depending upon the address data to be outputted to the scan path.

In the second preferred embodiment, on the other hand, the address generator circuit generates the SIW signal which is set to "0" only for the address to be written. When the address generator circuit writes the checker board pattern to the RAMs, the write data DI are given from a write data generator circuit for fixing the SIW signal while the address generator circuit generates one cycle of address pattern. The second preferred embodiment is similar in effects to the first preferred embodiment.

Figure 10:
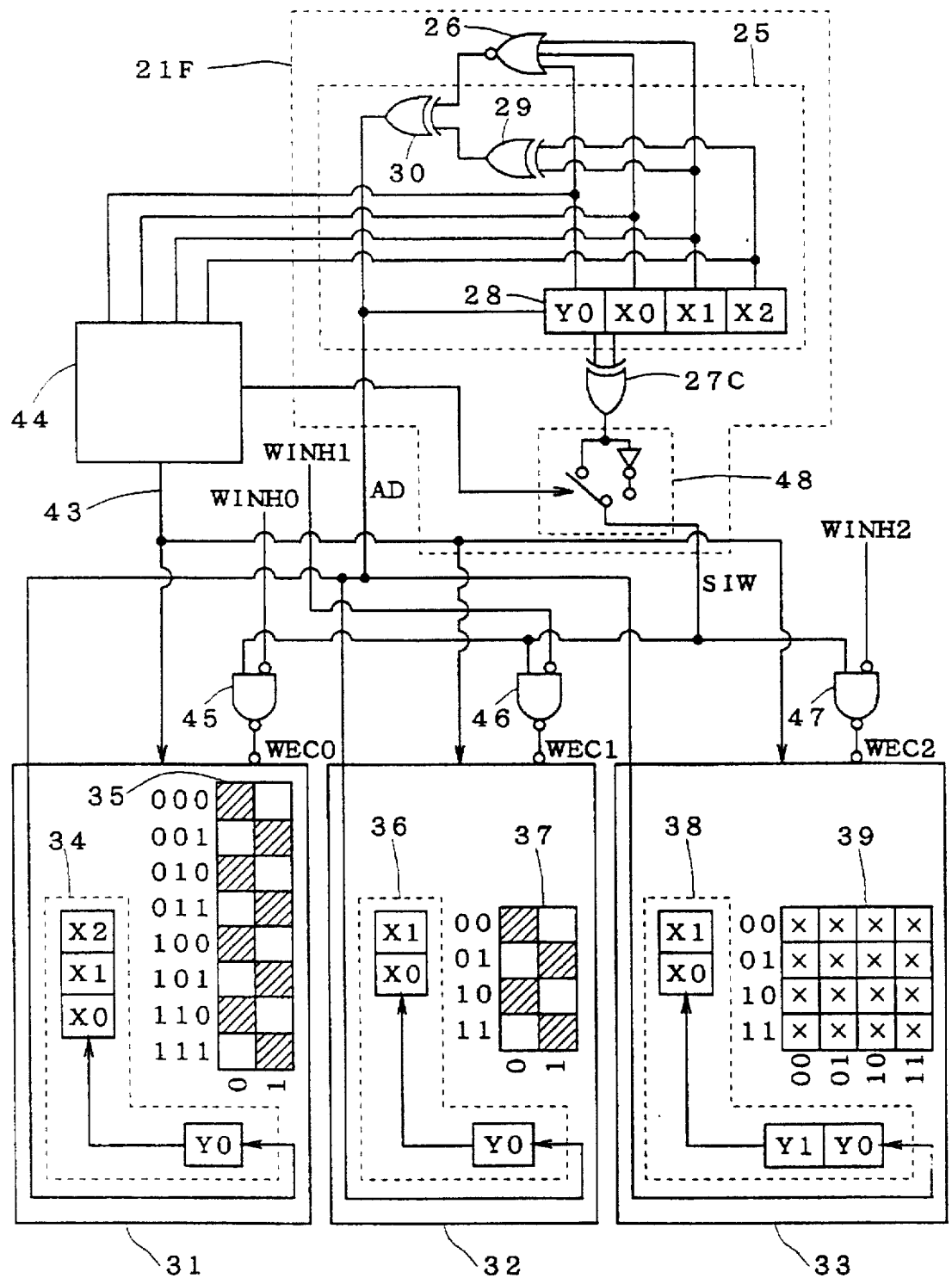
FIGS. 10 and 11 are block diagrams of the address generator circuits writing the checker board pattern according to a second preferred embodiment of the present invention.
Figure 11:
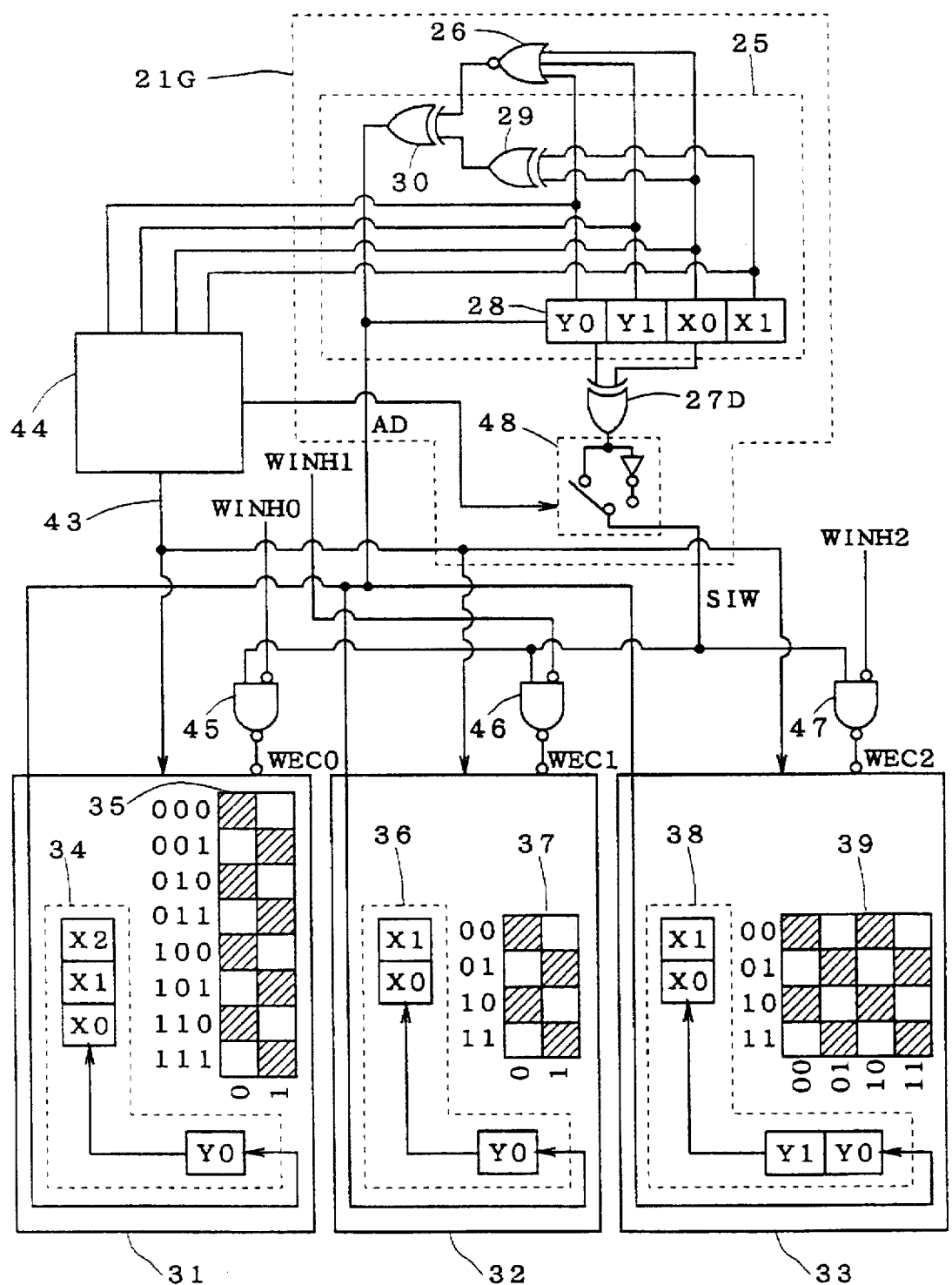

In FIGS. 10 and 11, the reference characters 21F and 21G designate address generator circuits; 43 designates a common signal line for providing the write data DI to the RAMs 31 to 33; 44 designates a write data generator circuit for generating the write data for writing the checker board pattern; 45 to 47 designate NOR gates for generating the write control signal WEC; and 48 designates an inverter circuit for inverting the write data DI in response to the output from the write data generator circuit 44. Other reference numerals and characters identical with those of FIG. 1 designate parts identical with or corresponding to those of FIG. 1.

To write the checker board pattern, the write data generator circuit 44 fixes the output thereof which is the write data DI to "1", for example. The write inhibit signals are set so that WINH0=0, WINH1=0, and WINH2=1, thereby disabling the write operation of the RAM 33 and enabling the write operation of the RAMs 31 and 32.

The address generator circuit 21F outputs the address pattern. When the address pattern outputted from the address generator circuit 21F satisfies X0 exor Y0=1, an XOR gate 27C outputs the SIW signal which is "1". Then, the inverter circuit 48 does not invert the output from the XOR gate 27C. Thus, the write data DI (DI=1 herein) are written to only the cells wherein the least significant bits of the X and Y addresses have different values in the RAMs 31 and 32.

The write data generator circuit 44 changes the output after the address generator circuit 21F has generated all addresses for the RAMs 31 to 33 to be tested, or after the one cycle of the test address patterns. The output from the write data generator circuit 44 is changed from "1" to "0" and fixed to "0". The switching of the connection is performed in the inverter circuit. The OR gates 45 to 47 output the logical OR between the XOR gate 27C and the write inhibit signals WINH0 to WINH2 as the write control signal WEC to the RAMs 31 to 33, respectively. Thus, the write data DI (DI=1 herein) are written to only the cells wherein the least significant bits of the X and Y addresses have the same value in the RAMs 31 and 32. The checker board pattern is written to the RAMs 31 and 32 as shown in FIG. 10.

The connection between the address generator circuits 21F, 21G and the NOR gates 45 to 47 is switched so that the SIW signal is applied from the XOR gate 27D to the OR gates 45 to 47. The write inhibit signals are set so that WINH0=1, WINH1=1, and WINH2=0, thereby enabling the write operation of the RAM 33 and disabling the write operation of the RAMs 31 and 32. The checker board pattern as shown FIG. 11 is similarly written to the memory cell array 39 in response to the SIW signal generated by the XOR gate 27D acting as a write signal generating means and the inverter circuit 48.

Third Preferred Embodiment

Figure 12:
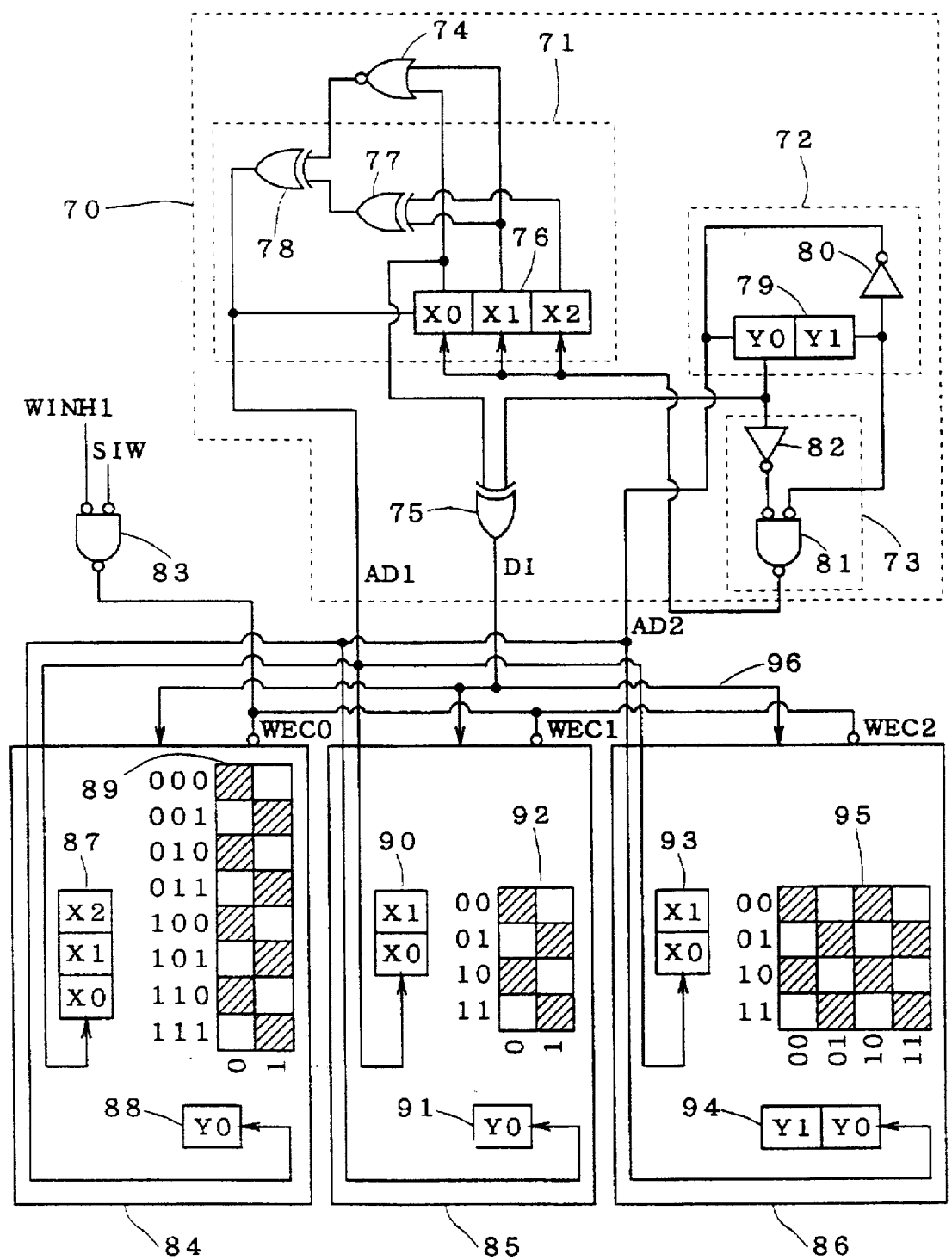
FIG. 12 is a block diagram of the address generator circuit writing the checker board pattern according to a third preferred embodiment of the present invention.

A third preferred embodiment according to the present invention is discussed below with reference to FIG. 12. FIG. 12 is a block diagram of the semiconductor memory device according to the third preferred embodiment.

In FIG. 12, the reference numeral 70 designates an address generator circuit for generating the write data DI for the memory cell arrays and the address pattern during testing so as to write the checker board pattern; 84 and 85 designate RAMs having different memory cell array structures; and 83 designates an OR gate common to the RAMs 84 to 86 for generating the write control signal WEC from the SIW signal and write inhibit signal WINH to output the write control signal WEC.

The RAM 84 includes a memory cell array 89, and first and second scan paths 87, 88 for indicating the address for the memory cell array 89. Data applied to the first scan path 87 are stored therein so that the data sequence from an input terminal of the first scan path 87 is the least significant bit X0 to be applied to an X decoder of the memory cell array 89, the second least significant bit X1 to be applied to the X decoder, and the most significant bit X2 to be applied to the X decoder.

The RAM 85 includes a memory cell array 92, and first and second scan paths 90, 91 for indicating the address for the memory cell array 92. Data applied to the first scan path 90 are stored therein so that the data sequence from an input terminal of the first scan path 90 is the least significant bit X0 to be applied to an X decoder of the memory cell array 92, and the most significant bit X1 to be applied to the X decoder.

The RAM 86 includes a memory cell array 95, and first and second scan paths 93, 94 for indicating the address for the memory cell array 95. Data applied to the first scan path 93 are stored therein so that the data sequence from an input terminal of the first scan path 93 is the least significant bit X0 to be applied to an X decoder of the memory cell array 95, and the second least significant bit X1 to be applied to the X decoder. Data applied to the second scan path 94 are stored therein so that the data sequence from an input terminal of the second scan path 94 is the least significant bit Y0 to be applied to a Y decoder of the memory cell array 95, and the second least significant bit Y1 to be applied to the Y decoder.

The address generator circuit 70 comprises an LFSR 71, a 2-bit shift register 72 for feeding the negation of the output from its last register back to the input of its first register, an NOR gate 74 for causing the LFSR 71 to output "0000", an XOR gate 75 serving as a write data generating means for generating the write data DI in response to predetermined bit values stored in a shift register 76 in the LFSR 71 and the shift register 72, and a clock generator circuit 73 for generating a clock for operating the shift register 76 in the LFSR 71.

The LFSR 71 of FIG. 12 is similar in construction to the LFSR 25 of FIG. 14. The relationship between the LFSR 71 and NOR gate 74 shown in FIG. 12 is similar to the relationship between the LFSR 25 and NOR gate 26 shown in FIG. 14. The 1-bit data stored in respective registers of the shift register 76 in the address generator circuit 70 are represented as X0, X1, X2 in ascending order of distance from the input terminal thereof. The 1-bit data stored in respective registers of a shift register 79 are represented as Y0, Y1 in ascending order of distance from the input terminal thereof.

The XOR gate 75 serving as the write data generating means for generating the write data DI in the address generator circuit 70 outputs the exclusive-OR of the data X0 stored in the register closest to the input terminal of the shift register 76 and the data Y0 stored in the register closest to the input terminal of the shift register 79.

The write data DI outputted from the XOR gate 75 are transmitted through a signal line 96 commonly connected to the RAMs 84 to 86.

The memory cell arrays 89, 92, 95 of the RAMs 84 to 86 are in the forms of an 8×2 matrix, a 4×2 matrix, and a 4×4 matrix, respectively.

The first scan paths 87, 90, 93 are commonly connected to the output terminal of an XOR gate 78 and the input terminal of the shift register 76. The first scan paths 87, 90, 93, and the shift register 76 receive the same data. The second scan paths 88, 91, 94 are commonly connected to the input terminal of the shift register 79 and the output terminal of an inverter 80. The second scan paths 88, 91, 94, and the shift register 79 receive the same data.

The address generator circuit 70 shown in FIG. 12 writes the checker board pattern. Independently of the number of addresses for the RAMs 84 to 86, the data stored in the first register of the first scan paths 87, 90, 93 match the data written to the first register of the shift register 76, and the data written to the first register of the second scan paths 88, 91, 94 match the data written to the first register of the shift register 79. The exclusive-OR of the data X0 stored in the shift register 76 and the data Y0 stored in the shift register 79 is used as the write data DI and applied to the RAMs 84 to 86, thereby permitting the simultaneous write operation of the checker board pattern to the RAMs 84 to 86 independently of the structure of the memory cell arrays. This requires only one write inhibit signal WINH.

The row bar pattern may be simultaneously written to the RAMs 84 to 86 by using the data X0 stored in the first register of the shift register 76 as the write data DI, and the column bar pattern may be simultaneously written to the RAMs 84 to 86 by using the data Y0 stored in the first register of the shift register 79 as the write data DI.

In this case, the one address generator circuit 70 may simultaneously writes the memory test pattern to the three RAMs 84 to 86, effectively reducing the size of the RAM-BIST circuit 14.

Figure 13:
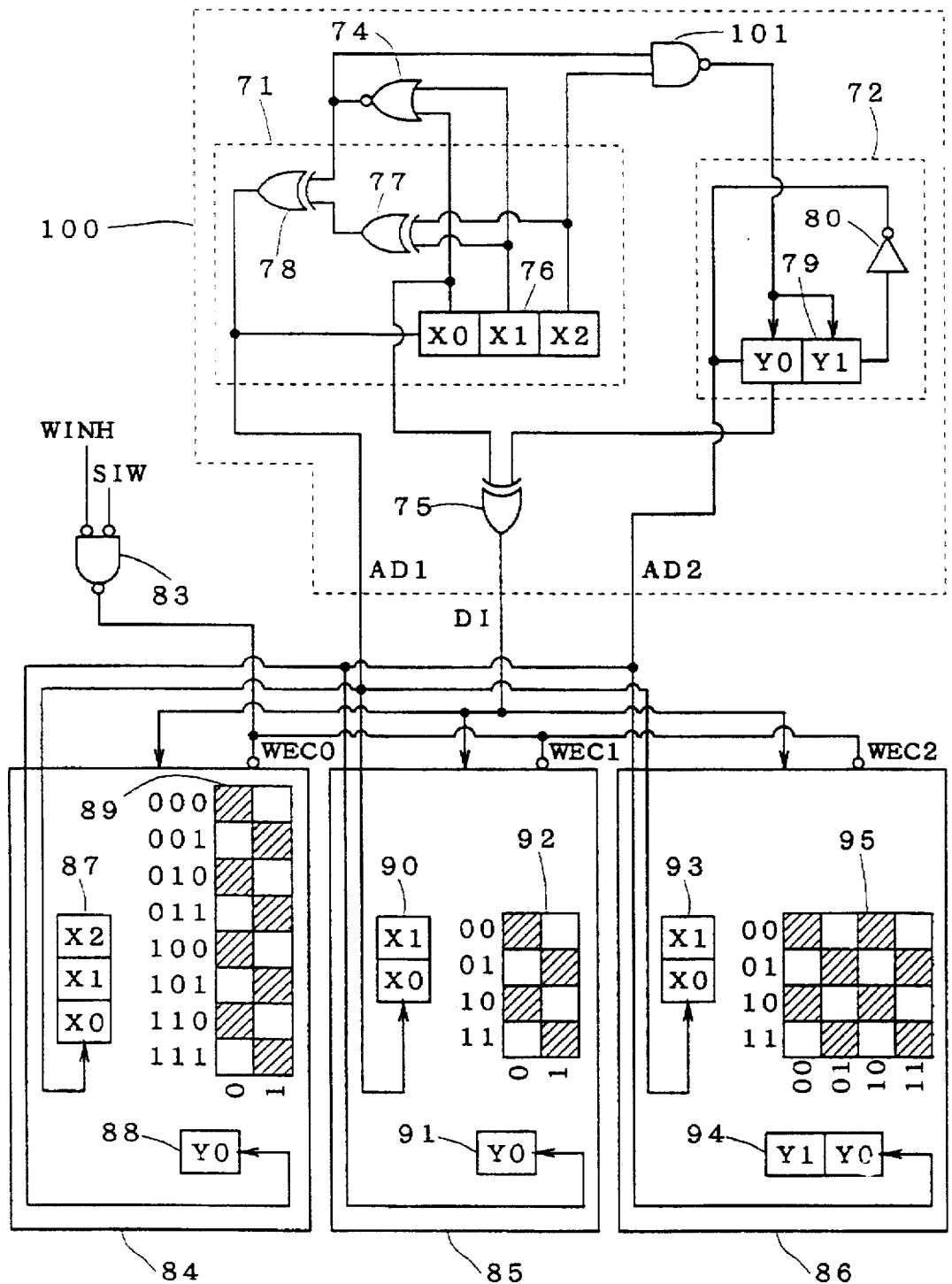
FIG. 13 is a block diagram of the address generator circuit writing the checker board pattern according to another form of the third preferred embodiment of the present invention.

FIG. 13 is a block diagram of an address generator circuit according to another form of the third preferred embodiment. In FIG. 13, the reference numeral 100 designates an address generator circuit corresponding to the address generator circuit 70 of FIG. 12. Other reference numerals and characters identical with those of FIG. 12 designate parts identical with or corresponding to those of FIG. 12.

The address generator circuit 100 of FIG. 13 differs from the address generator circuit 70 of FIG. 12 in that the address generator circuit 100 generates a clock for operating the shift register 79 depending upon the state of the shift register 76 while the address generator circuit 70 generates a clock for operating the shift register 76 depending upon the state of the shift register 79. Thus, the address generator circuit 100 further comprises an NAND gate 101 for outputting the NAND of the output from the NOR gate 74 and the output from the last register of the shift register 76 to the respective registers of the shift register 79. The address generator circuit 100 of FIG. 13 may write the checker board pattern to the RAMs 84 to 86 having different memory cell array structures for the same reason as the address generator circuit 70.

In the third preferred embodiment, the shift register 72 for storing the data Y0 and Y1 includes only two registers, resulting in a structure different from the LFSR for providing feedback by the XOR gate. However, the LFSR is used for storage of an address which is 3 bits or more in length.

Description will be given on writing the checker board pattern to a plurality of RAMs of different constructions when the RAMs including memory cell arrays having the same number of columns are not simultaneously processed.

Figure 15:
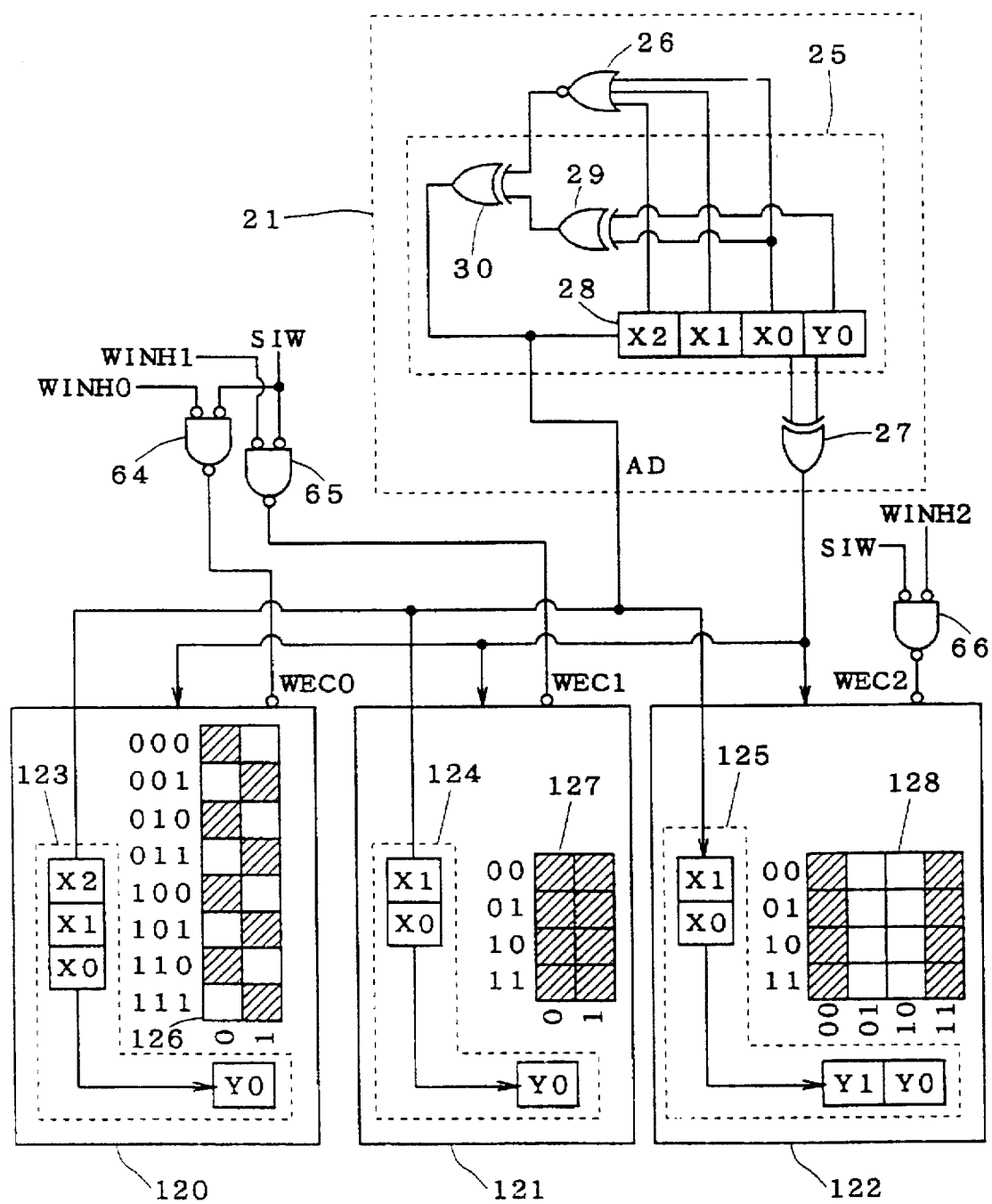
FIG. 15 is a block diagram of a semiconductor memory device when the checker board pattern is not simultaneously written.
Figure 16:
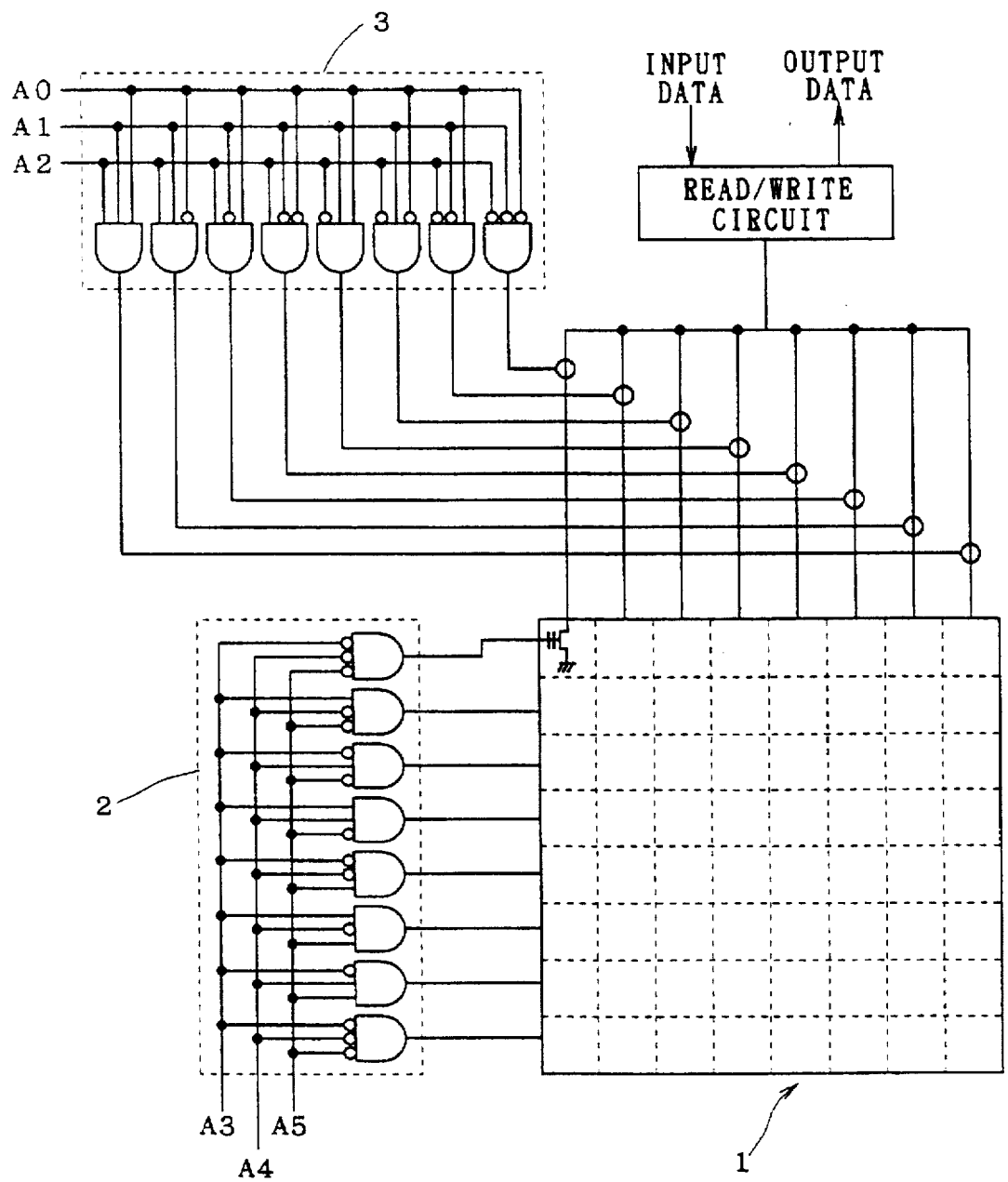
FIG. 16 is a logic diagram showing the relation between a memory cell array to which the checker board pattern is written and decoders.

FIG. 15 illustrates writing the checker board pattern to three RAMs 120 to 122 which are different in the number of X addresses and the number of Y addresses.

The RAM 120 has a memory cell array 126 of an 8×2 matrix form, the RAM 121 has a memory cell array 127 of a 4×2 matrix form, and the RAM 122 has a memory cell array 128 of a 4×4 matrix form.

The checker board pattern is not correctly written to the RAM 121 as shown in FIG. 15 when the checker board pattern is written to the RAM 120 in the same manner as the address generator circuit 21A of FIG. 1. Conventional scan paths 123 and 124 are designed such that the more significant bits of the X and Y addresses are stored in the registers closer to the input terminal. The data Y0 stored in the last register of the shift register 28 does not match the data Y0 stored in the last register of the scan path 124, and the data X0 stored in the third register of the shift register 28 does not match the data X0 stored in the second register of the scan path 124. In this manner, the checker board pattern is not written to the RAM 121.

While the invention has been described in detail, the foregoing description is in all aspects illustrative and not restrictive. It is understood that numerous other modifications and variations can be devised without departing from the scope of the invention.

We claim:

1. A semiconductor memory device comprising:
   a first memory circuit including,
     a first memory cell array of matrix form having memory cells each specified by a first vertical address dam indicative of one of a number of rows and a number of columns and a first horizontal address data indicative of the other number, and
     a first scan path having,
       a first input terminal,
       α registers, α being a natural number, for storing said first vertical address data therein, and
       β registers, β being a natural number, for storing said first horizontal address data therein, said α registers being closer to said input terminal than said β register;
   a second memory circuit including,
     a second memory cell array of matrix form having memory cells each specified by a second vertical address data indicative of the same one of the number of rows and the number of columns as said first vertical address data indicated and second horizontal address data indicative of the other number, and
     a second scan path having,
       a second input terminal,
       α registers for storing said second vertical address data therein, and
       γ registers γ being a natural number and not equal to β, for storing said second horizontal address data therein, said α registers being closer to said second input terminal than said γ registers; and
   an address generator circuit including,
     a shift register for serially receiving at an input terminal thereof a test address pattern to be outputted simultaneously to said first and second scan paths to store said test address pattern therein, and
     write signal generating means for generating a write signal in association with said test address pattern on the basis of data stored in a predetermined register of said shift register, wherein said α registers of said first scan path and said α registers of said second scan path being arranged such that less significant bits of said first and second vertical address data are stored in respective first subsets of said α registers positioned closer to respective of said first input terminal and said second input terminal than resistive second subsets of said α registers which store more significant bits, and less significant bits of said first and second horizontal address data are stored in respective first subsets of said β registers and said γ registers positioned closer to said first and second input terminals than a second subset of said β registers and said γ registers which store more significant bits, and wherein write data transmitted through a signal line common to said first and second memory circuits are written to said first and second memory cell arrays in said first and second memory circuits according to said test address pattern and said write signal.

2. The semiconductor memory device of claim 1, wherein said write signal generating means includes a logic device for outputting the exclusive-OR of data stored in a first register of said shift register and data stored in an (a+1)-th register thereof.

3. The semiconductor memory device of claim 1, further comprising:
   a third memory circuit including,
     a third memory cell array of matrix form having memory cells each specified by third vertical address data indicative of one of a number of rows and a number of columns of said third memory cell array and third horizontal address data indicative of the other number, and
     a third scan path having,
       a third input terminal,
       δ registers, δ being a natural number and not equal to α, for storing said third vertical address dam therein, and
       ε resisters, ε being a natural number and not equal to β or γ, for storing said third horizontal address data therein, said δ registers being closer to said input terminal than said ε registers,
   wherein said signal line common 16 said first and second memory circuits also being common to said third memory circuit,
   said write data transmitted through said signal line are written to said third memory cell array in said third memory circuit according to said test address pattern and said write signal, and
   write permission/inhibition of said first to third memory circuits being individually controllable by write control signals.

4. The semiconductor memory device of claim 3, wherein said write signal generating means includes a logic device for outputting the exclusive-OR of data stored in a first register of said shift register and data stored in an (α+1)-th register thereof.

5. The semiconductor memory device of claim 1, wherein said write signal is used as said write data.

6. The semiconductor memory device of claim 5, wherein said write signal generating means includes a logic device for outputting the exclusive-OR of data stored in a first register of said shift register and data stored in an (α+1)-th register thereof.

7. The semiconductor memory device of claim 6, further comprising:
   a third memory circuit having a third memory cell array of matrix form having memory cells each specified by third vertical address data indicative of one of a number of rows and a number of columns of said third memory cell array and third horizontal address data indicative of the other number, and a third scan path having,
a third input terminal,
δ registers, δ being a natural number and not equal to α, for storing said third vertical address data therein, and
ε registers, ε being a natural number and not equal to β or γ, for storing said third horizontal address data therein, said δ registers being closer to said input terminal than said β registers, wherein said signal line common to said first and second memory circuits also being common to said third memory circuit, said write data transmitted through said signal line are written to said third memory cell array in said third memory circuit according to said test address pattern and said write signal, and write permission/inhibition of said first to third memory circuits being individually controllable by write control signals.

8. The semiconductor memory device of claim 1, further comprising:

data generating means for generating said write data, wherein write permission/inhibition of said first and second memory circuits is controlled in response to write control signals, and wherein said write control signals is generated on the basis of said write signal.

9. The semiconductor memory device of claim 8, wherein said write signal generating means includes a logic device for outputting the exclusive-OR of data stored in a first register of said shift register and data stored in an (α+1)-th register thereof.

10. The semiconductor memory device of claim 9, further comprising:

a third memory circuit including a third memory cell array of matrix form having memory cells each specified by third vertical address data indicative of one of a number of rows and a number of columns and third horizontal address data indicative of the other number, and a third scan path having,
a third input terminal,
δ registers, δ being a natural number and not equal to α, for storing said third vertical address data therein, and
ε resisters, ε being a natural number and not equal to β or γ, for storing said third horizontal address data therein, said δ registers being closer to said input terminal than said β registers; and wherein said signal line common to said first and second memory circuits also being common to said third memory circuit, said write dam transmitted through said signal line are written to said third memory cell array in said third memory circuit according to said test address pattern and said write signal, and write permission/inhibition of said first to third memory circuits is individually controllable by write control signals.

11. The semiconductor memory device of claim 10, wherein said write signal generating means includes a logic device for outputting the exclusive-OR of data stored in a first register of said shift register and data stored in an (α+1)-th register thereof.

12. A semiconductor memory device comprising:

a plurality of memory circuits each including a memory cell array having a first scan path for storing first row address data for said memory cell array therein, and a second scan path for storing first column address data for said memory cell array therein;

an address generator circuit including a first shift register for storing second row address data therein so as to output a first test address pattern to said first scan path, a second shift register for storing second column address data therein so as to output a second test address pattern to said second scan path, and write signal generating means for generating a write signal for said memory coil array in association with said first and second test address patterns on the basis of at least data stored in registers in said first and second shift registers; and said first scan path having,
a first input terminal, and
a first set of registers, wherein a first subset of said first set of registers being configured to hold less significant bits of said first row address data and positioned closer to said first input terminal than a second subset of said first set of registers, said second subset of said first set of registers being configured to hold more significant bits of said first row address data, said second scan path having,
a second input terminal, and
a second set of registers, wherein a first subset of said second set of registers being configured to hold less significant bits of said first column address data and positioned closer to said second input terminal than a second subset of said second set of registers, said second subset of said second set of registers being configured to hold more significant bits of said first column address data, said first shift register having,
a first shift register input terminal, and
first shift register positions, each configured to hold a data bit, a first subset of said first shift register positions being configured to hold less significant bits of said second row address and located closer to said first shift register input terminal than a second subset of said first shift register positions, said second subset of said first shift register positions being configured to hold more significant bits of said second row address data, said second shift register having,
a second shift register input terminal, and
second shift register positions, each configured to hold a dam bit, a first subset of said second shift register positions being configured to hold less significant bits of said second column address and located closer to said second shift register input terminal than a second subset of said second shift register positions, said second subset of said second shift register positions being configured to hold more significant bits of said second column address data, wherein write data are written to said memory cell array in each of said plurality of memory circuits according to said first and second test address patterns and said write signal.

13. The semiconductor memory device of claim 12, wherein said write signal generating means includes a logic device for outputting the exclusive-OR of data stored in a first register position of said first shift register and data stored in a first register position of said second shift register.

14. The semiconductor memory device of claim 12, wherein said first shift register shifts data each time said second shift register completes one cycle of operation.

* * * * *